United States Patent [19]
Wu et al.

[11] Patent Number: 5,757,051
[45] Date of Patent: May 26, 1998

[54] STATIC MEMORY CELL AND METHOD OF MANUFACTURING A STATIC MEMORY CELL

[75] Inventors: Jeff Zhiqiang Wu, Meridian; Joseph Karniewicz, Boise, both of Id.

[73] Assignee: Micron Technology, Inc., Boise, Id.

[21] Appl. No.: 745,458

[22] Filed: Nov. 12, 1996

[51] Int. Cl.[6] .............. H01L 29/76; H01L 29/94; H01L 31/062; H01L 31/113
[52] U.S. Cl. .............. 257/368; 257/25; 257/104; 257/314
[58] Field of Search .............. 257/314–316, 257/25, 30, 903, 104–5, 368, 167, 172, 480, 489; 437/60, 126, 438; 365/175–177

[56] References Cited

U.S. PATENT DOCUMENTS

| 4,198,644 | 4/1980 | Esaki | 357/12 |
|---|---|---|---|
| 4,360,897 | 11/1982 | Lehovec | 365/159 |
| 4,396,999 | 8/1983 | Malaviya | 365/159 |
| 5,032,891 | 7/1991 | Takagi et al. | 357/41 |
| 5,099,191 | 3/1992 | Galler et al. | 323/313 |
| 5,225,700 | 7/1993 | Smayling | 257/321 |
| 5,321,285 | 6/1994 | Lee et al. | 257/296 |
| 5,416,040 | 5/1995 | Beam, III et al. | 437/60 |
| 5,422,305 | 6/1995 | Seabaugh et al. | 437/126 |
| 5,486,706 | 1/1996 | Yuki et al. | 257/25 |
| 5,534,714 | 7/1996 | Beam, III et al. | 257/25 |
| 5,587,944 | 12/1996 | Shen et al. | 365/175 |
| 5,629,546 | 5/1997 | Wu et al. | 257/368 |

FOREIGN PATENT DOCUMENTS

| 62-8559 | 1/1987 | Japan. |
|---|---|---|
| 6-29493 | 2/1994 | Japan. |

OTHER PUBLICATIONS

Press Release, "Texas Instruments Develops New Silicon Switching Device for Future Integrated Circuits". No date.

*Primary Examiner*—Tom Thomas
*Assistant Examiner*—Adriana Giordana
*Attorney, Agent, or Firm*—Wells, St. John, Roberts, Gregory & Matkin, P.S.

[57] ABSTRACT

A static memory cell having no more than three transistors. A static memory cell comprises a semiconductor substrate of a first conductivity type; a buried layer in the substrate, the buried layer having a second conductivity type opposite to the first conductivity type; a transistor formed over the buried layer, the transistor having a source of the second conductivity type, a gate, and a drain of the second conductivity type, the source having a depth in the substrate greater than the depth of the drain; and alternating layers of insulative and conductive material formed proximate -the source, including two conductive layers and two insulative layers, one of the insulative layers being in junction relation to the source.

34 Claims, 13 Drawing Sheets

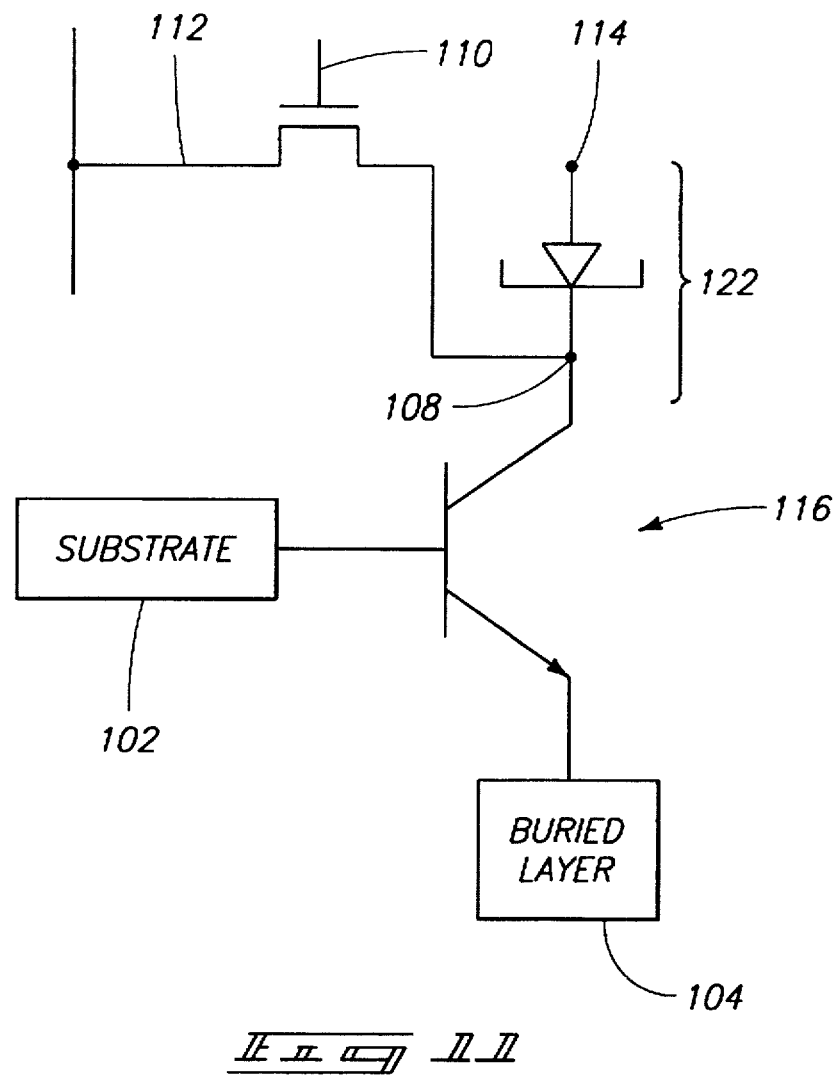

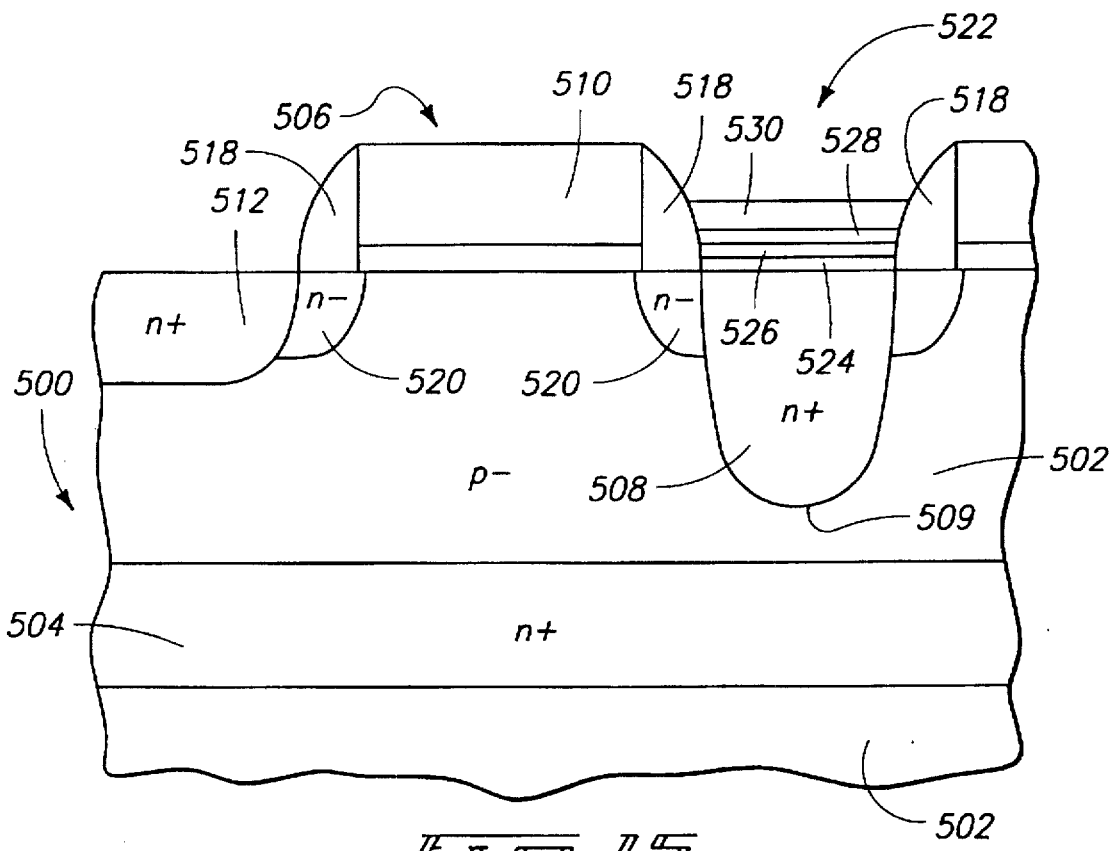
_Fig 15_
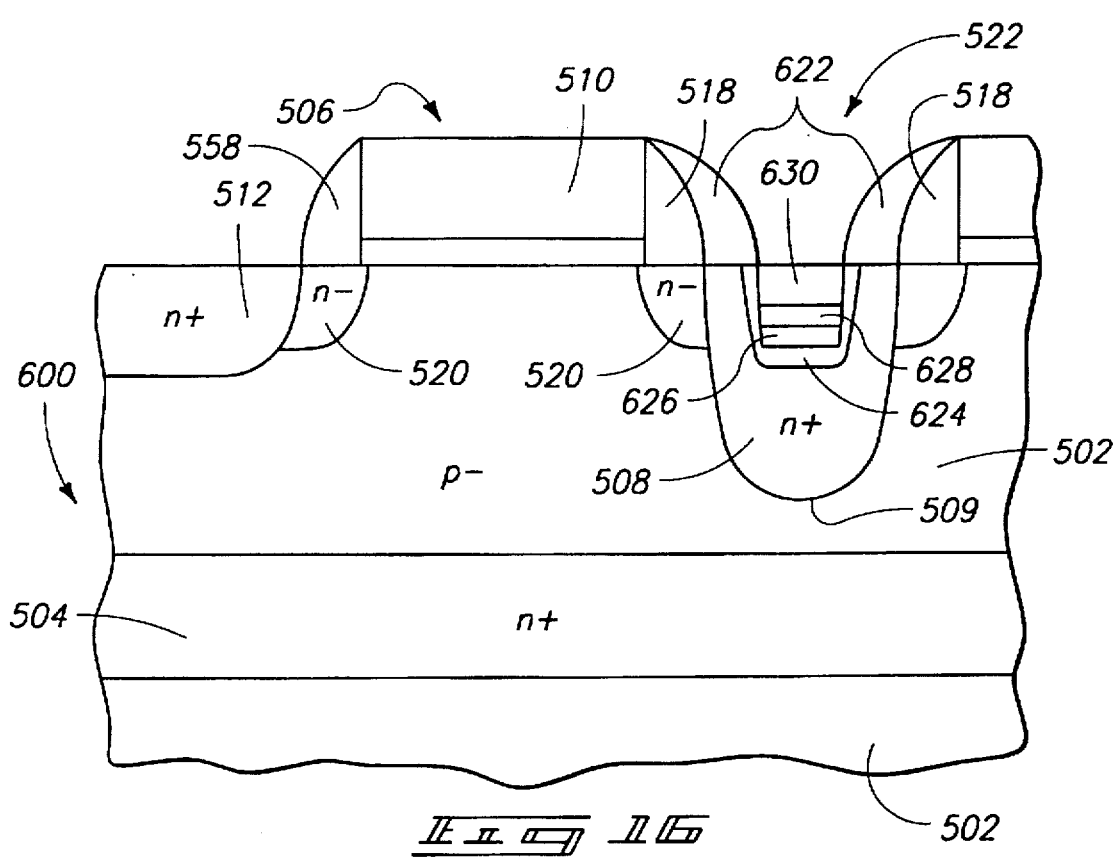
_Fig 16_

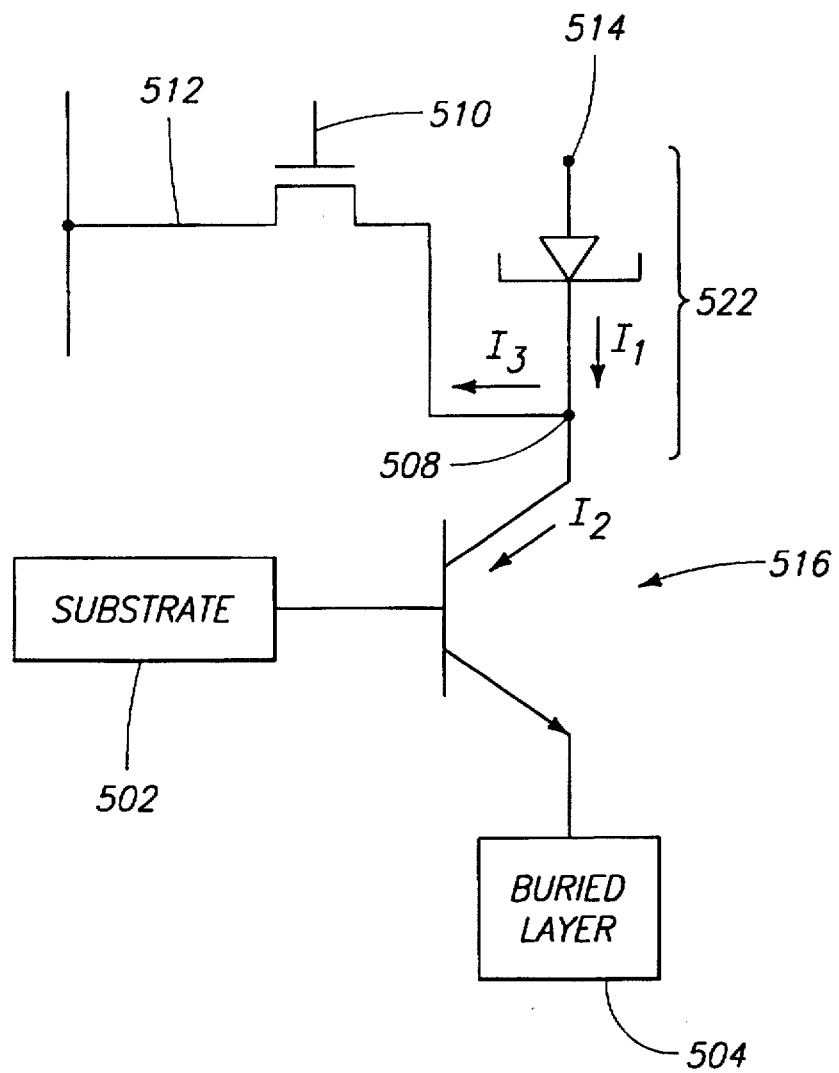

5,757,051

1

STATIC MEMORY CELL AND METHOD OF MANUFACTURING A STATIC MEMORY CELL

TECHNICAL FIELD

The invention relates to static memory cells.

BACKGROUND OF THE INVENTION

FIG. 1 shows a prior art static read/write memory cell 10 such as is typically used in high-density static random access memories (SRAMs). A static memory cell is characterized by operation in one of two mutually-exclusive and self-maintaining operating states. Each operating state defines one of the two possible binary bit values, zero or one. A static memory cell typically has an output which reflects the operating state of the memory cell. Such an output produces a "high" voltage to indicate a "set" operating state. The memory cell output produces a "low" voltage to indicate a "reset" operating state. A low or reset output voltage usually represents a binary value of zero, while a high or set output voltage represents a binary value of one.

Static memory cell 10 generally comprises first and second inverters 12 and 14 which are cross-coupled to form a bistable flip-flop. Inverters 12 and 14 are formed by n-channel driver transistors 16 and 17, and p-channel load transistors 18 and 19. Driver transistors 16 and 17 are typically metal oxide silicon field effect transistors (MOSFETs) formed in an underlying silicon semiconductor substrate. P-channel transistors 18 and 19 are typically thin film transistors formed above the driver transistors.

The source regions of driver transistors 16 and 17 are tied to a low reference or circuit supply voltage, labelled $V_{ss}$ and typically referred to as "ground." Load transistors 18 and 19 are connected in series between a high reference or circuit supply voltage, labelled $V_{cc}$, and the drains of the corresponding driver transistors 16 and 17. The gates of load transistors 18 and 19 are connected to the gates of the corresponding driver transistors 16 and 17.

Inverter 12 has an inverter output 20 formed by the drain of driver transistor 16. Similarly, inverter 14 has an inverter output 22 formed by the drain of driver transistor 17. Inverter 12 has an inverter input 24 formed by the gate of driver transistor 16. Inverter 14 has an inverter input 26 formed by the gate of driver transistor 17.

The inputs and outputs of inverters 12 and 14 are cross-coupled to form a flip-flop having a pair of complementary two-state outputs. Specifically, inverter output 20 is cross-coupled to inverter input 26, and inverter output 22 is cross-coupled to inverter input 24. In this configuration, inverter outputs 20 and 22 form the complementary two-state outputs of the flip-flop.

A memory flip-flop such as that described typically forms one memory element of an integrated array of static memory elements. A plurality of access transistors, such as access transistors 30 and 32, are used to selectively address and access individual memory elements within the array. Access transistor 30 has one active terminal connected to cross-coupled inverter output 20. Access transistor 32 has one active terminal connected to cross-coupled inverter output 22. A plurality of complementary column line pairs, such as the single pair of complementary column lines 34 and 36 shown, are connected to the remaining active terminals of access transistors 30 and 32, respectively. A row line 38 is connected to the gates of access transistors 30 and 32.

Reading static memory cell 10 requires activating row line 38 to connect inverter outputs 20 and 22 to column lines

2

34 and 36. Writing to static memory cell 10 requires first placing selected complementary logic voltages on column lines 34 and 36, and then activating row line 38 to connect those logic voltages to inverter outputs 20 and 22. This forces the outputs to the selected logic voltages, which will be maintained as long as power is supplied to the memory cell, or until the memory cell is reprogrammed.

FIG. 2 shows an alternative prior art static read/write memory cell 50 such as is typically used in high-density static random access memories. Static memory cell 50 comprises n-channel pulldown (driver) transistors 80 and 82 having drains respectively connected to load elements or resistors 84 and 86. Transistors 80 and 82 are typically metal oxide silicon field effect transistors (MOSFETs) formed in an underlying silicon semiconductor substrate.

The source regions of transistors 80 and 82 are tied to a low reference or circuit supply voltage, labelled $V_{ss}$ and typically referred to as "ground." Resistors 84 and 86 are respectively connected in series between a high reference or circuit supply voltage, labelled $V_{cc}$, and the drains of the corresponding transistors 80 and 82. The drain of transistor 82 is connected to the gate of transistor 80 by line 76, and the drain of transistor 80 is connected to the gate of transistor 82 by line 74 to form a flip-flop having a pair of complementary two-state outputs.

A memory flip-flop, such as that described above in connection with FIG. 2, typically forms one memory element of an integrated array of static memory elements. A plurality of access transistors, such as access transistors 90 and 92, are used to selectively address and access individual memory elements within the array Access transistor 90 has one active terminal connected to the drain of transistor 80. Access transistor 92 has one active terminal connected to the drain of transistor 82. A plurality of complementary column line pairs, such as the single pair of complementary column lines 52 and 54 shown, are connected to the remaining active terminals of access transistors 90 and 92, respectively. A row line 56 is connected to the gates of access transistors 90 and 92.

Reading static memory cell 50 requires activating row line 56 to connect outputs 68 and 72 to column lines 52 and 54. Writing to static memory cell 10 requires first placing selected complementary logic voltages on column lines 52 and 54, and then activating row line 56 to connect those logic voltages to outputs 68 and 72. This forces the outputs to the selected logic voltages, which will be maintained as long as power is supplied to the memory cell, or until the memory cell is reprogrammed.

A static memory cell is said to be bistable because it has two stable or self-maintaining operating states, corresponding to two different output voltages. Without external stimuli, a static memory cell will operate continuously in a single one of its two operating states. It has internal feedback to maintain a stable output voltage, corresponding to the operating state of the memory cell, as long as the memory cell receives power.

The two possible output voltages produced by a static memory cell correspond generally to upper and lower circuit supply voltages. Intermediate output voltages, between the upper and lower circuit supply voltages, generally do not occur except for during brief periods of memory cell power-up and during transitions from one operating state to the other operating state.

The operation of a static memory cell is in contrast to other types of memory cells such as dynamic cells which do not have stable operating states. A dynamic memory cell can be programmed to store a voltage which represents one of two binary values, but requires periodic reprogramming or "refreshing" to maintain this voltage for more than very short time periods.

A dynamic memory cell has no internal feedback to maintain a stable output voltage. Without refreshing, the output of a dynamic memory cell will drift toward intermediate or indeterminate voltages, resulting in loss of data. Dynamic memory cells are used in spite of this limitation because of the significantly greater packaging densities which can be attained. For instance, a dynamic memory cell can be fabricated with a single MOSFET transistor, rather than the six transistors typically required in a static memory cell. Because of the significantly different architectural arrangements and functional requirements of static and dynamic memory cells and circuits, static memory design has developed along generally different paths than has the design of dynamic memories.

Tunnel diodes are known in the art. A tunnel diode is a diode having a p-n junction, with both sides of the junction highly doped (p+/n+). In other words, both sides of the diode are doped into degeneracy. Because of the high doping levels, tunnelling of electrons is permitted in the forward direction across the junction (i.e., when a positive voltage is applied to the p+ region). FIG. 3 is an energy band diagram of a tunnel diode. As applied positive bias increases, the height of the potential barrier at the junction decreases, and the width increases. As positive bias increases, the tunnel diode exhibits a characteristic with a negative differential resistance portion, as tunnel effect contributes progressively less towards conductance of the diode (FIG. 4). As positive bias further increases, current reaches a valley point 96 where tunnel effect ceases. For voltages above the valley point 96, the tunnel diode behaves like an ordinary p-n junction diode. The dashed line in FIG. 4 represents the characteristic of an ordinary p-n junction diode. Tunnelling also occurs in the reverse direction in a manner similar to that for a Zener diode, except that breakdown voltage occurs at a small positive value of voltage, at peak point 98. Tunnel diodes are described in greater detail in U.S. Pat. No. 4,198,644 to Esaki, which is incorporated by reference.

Attention is also directed to applicants' application Ser. No. 08/492,774, filed Jun. 21, 1995, titled "NOVEL STATIC MEMORY CELL AND METHOD OF MANUFACTURING A STATIC MEMORY CELL."

Resonant tunnel diodes (or "resonant tunneling diodes," or "double-barrier electron resonators") are also known in the art. A resonant tunnel diode has many different on and off states. Texas Instruments has constructed a resonant tunnel diode for an integrated circuit. They started with a crystalline silicon substrate. Then, using ultra-high vacuum techniques, they deposited three ultra-thin layers. First, they deposited a layer of silicon dioxide ($SiO_2$), then a layer of silicon, then another layer of silicon dioxide. The ultra-thin layers were each about 10–20 atoms thick, or about 5 billionths of a meter thick. They then attached electrical contacts to the top and bottom.

Electrons trying to pass through the resonant tunnel diode, in the direction from the bottom contact to the top contact, see the silicon dioxide layers as barriers. Each silicon dioxide layer is called a "tunnel barrier." The silicon layer is called a "quantum well." When a small voltage is applied to the resonant tunnel diode, very few electrons are able to tunnel through both of the silicon dioxide layers. Current flow is therefore negligible, and the device is in an "off" state. As voltage increases, energy of electrons increases and the wavelength of the electrons shortens. Eventually, a whole number of electron wavelengths fits inside the silicon layer, and a resonance condition is created. Electrons that are able to tunnel through the first silicon dioxide layer reflect back and forth many times, and some are eventually able to tunnel through the second silicon dioxide layer. Therefore, many electrons flow through the structure and an "on" condition is established. As voltage is further increased, there are no longer electrons with the correct wavelength to pass through, and another "off" condition is established. As voltage further increases, the resonance condition can change again to allow large numbers of electrons to pass through. The number of distinct on or off states that can occur is determined by materials and sizes. FIG. 5 is a current-voltage characteristic of a resonant tunnel diode having five double barriers, and showing the multiple possible on or off states.

A resonant tunnel diode can switch on and off quickly because electrons don't have to travel very far (e.g., they only have to travel about 100 Angstroms or 0.01 microns).

SUMMARY OF THE INVENTION

The invention provides a static memory cell having more than two logic states. More particularly, the invention provides a static memory cell comprising a resonant tunnel diode.

BRIEF DESCRIPTION OF THE DRAWINGS

Preferred embodiments of the invention are described below with reference to the following accompanying drawings.

FIG. 12 is a current-voltage characteristic diagram of the static memory cell of FIG. 9.

FIG. 15 is a diagrammatic sectional view of a wafer fragment comprising another alternative static memory cell embodying the invention and including a resonant tunnel diode.

FIG. 16 is a diagrammatic sectional view of a wafer fragment comprising another alternative static memory cell embodying the invention and including a resonant tunnel diode.

FIG. 17 is a circuit schematic of the static memory cell of FIG. 15.

FIG. 18 is a current-voltage characteristic diagram of the static memory cell of FIG. 15.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
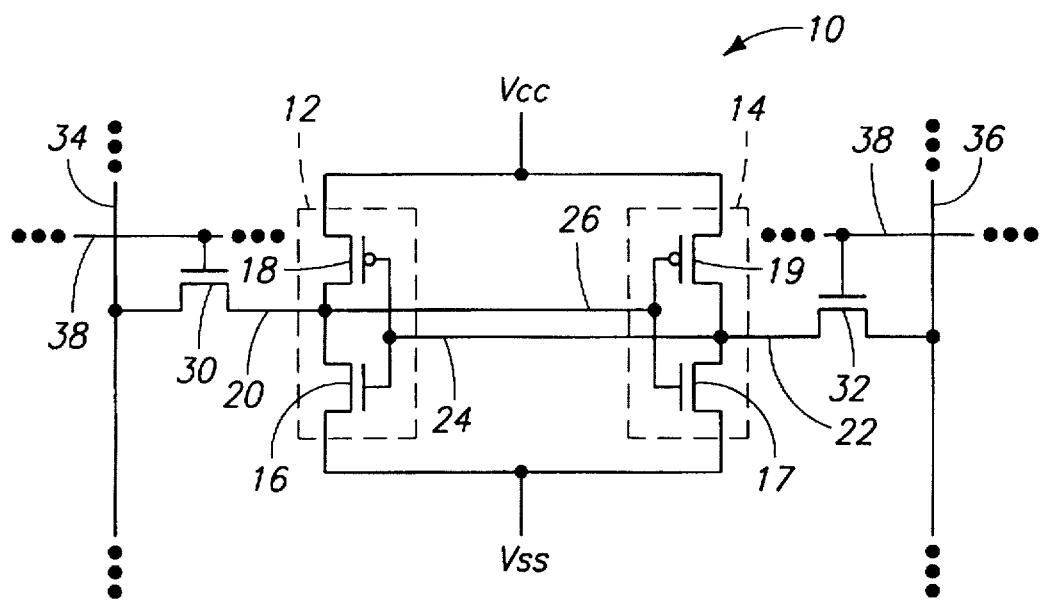
FIG. 1 is a circuit schematic of a prior art static memory cell.
Figure 2:
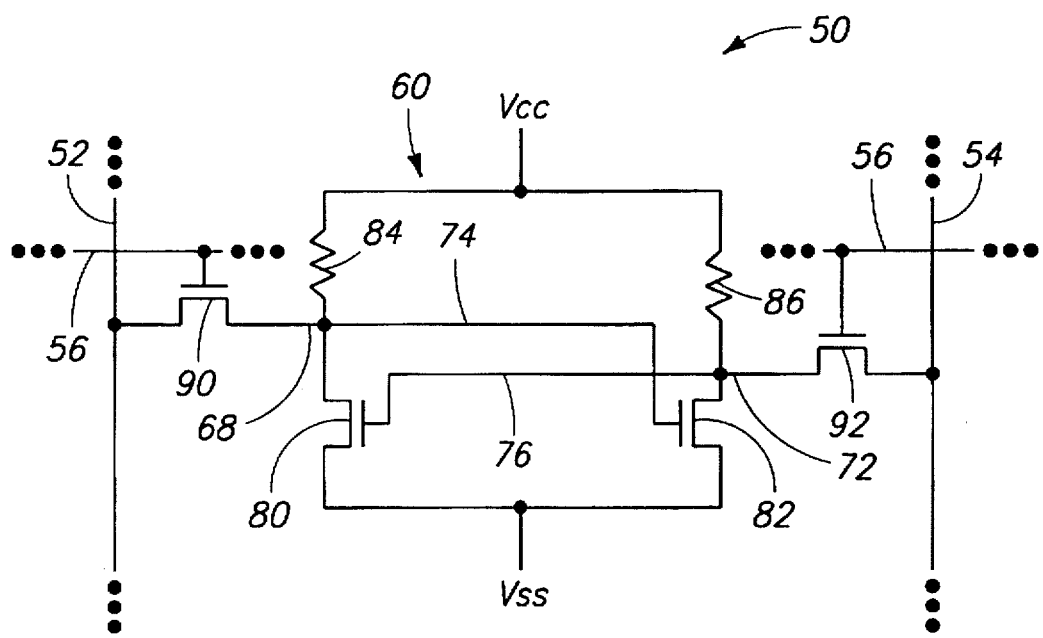
FIG. 2 is a circuit schematic of another prior art static memory cell.
Figure 3:
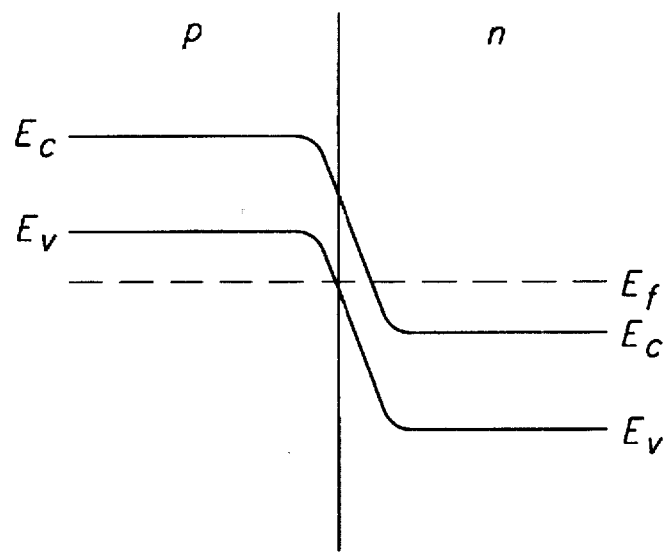
FIG. 3 is an energy band diagram of a prior art tunnel diode.
Figure 4:
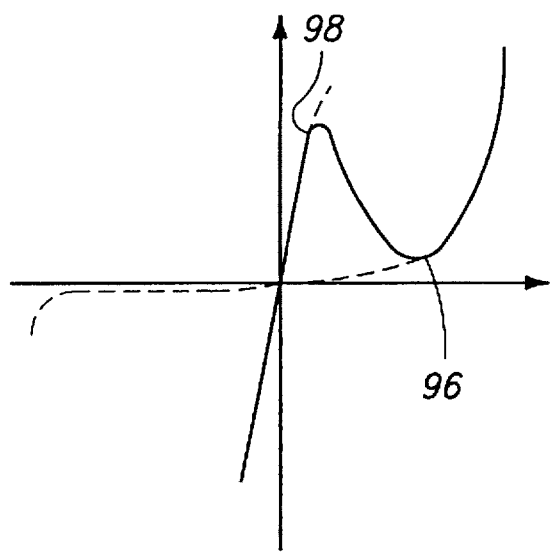
FIG. 4 is a current-voltage characteristic diagram of the prior art tunnel diode of FIG. 3.
Figure 5:
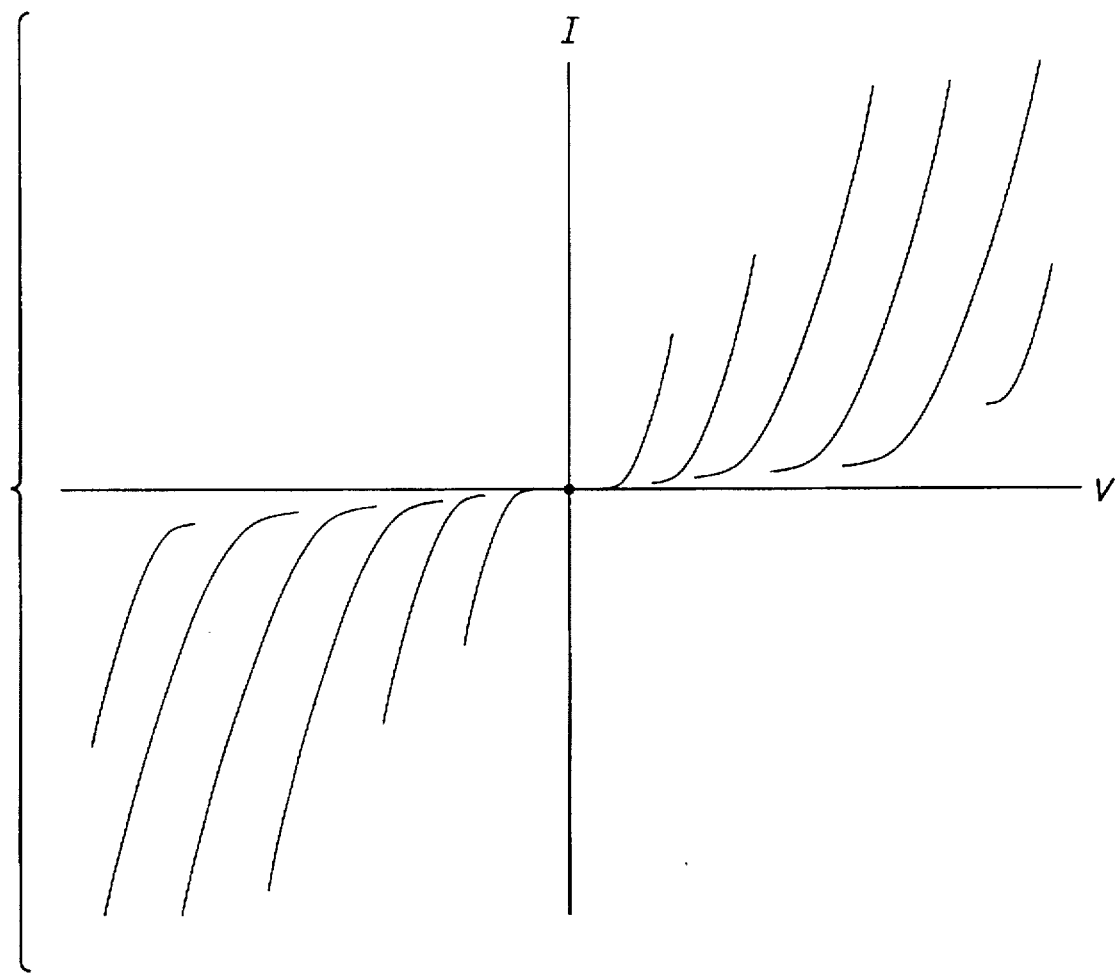
FIG. 5 is a current-voltage characteristic diagram of a prior art resonant tunnel diode of FIG. 3.
Figure 6:
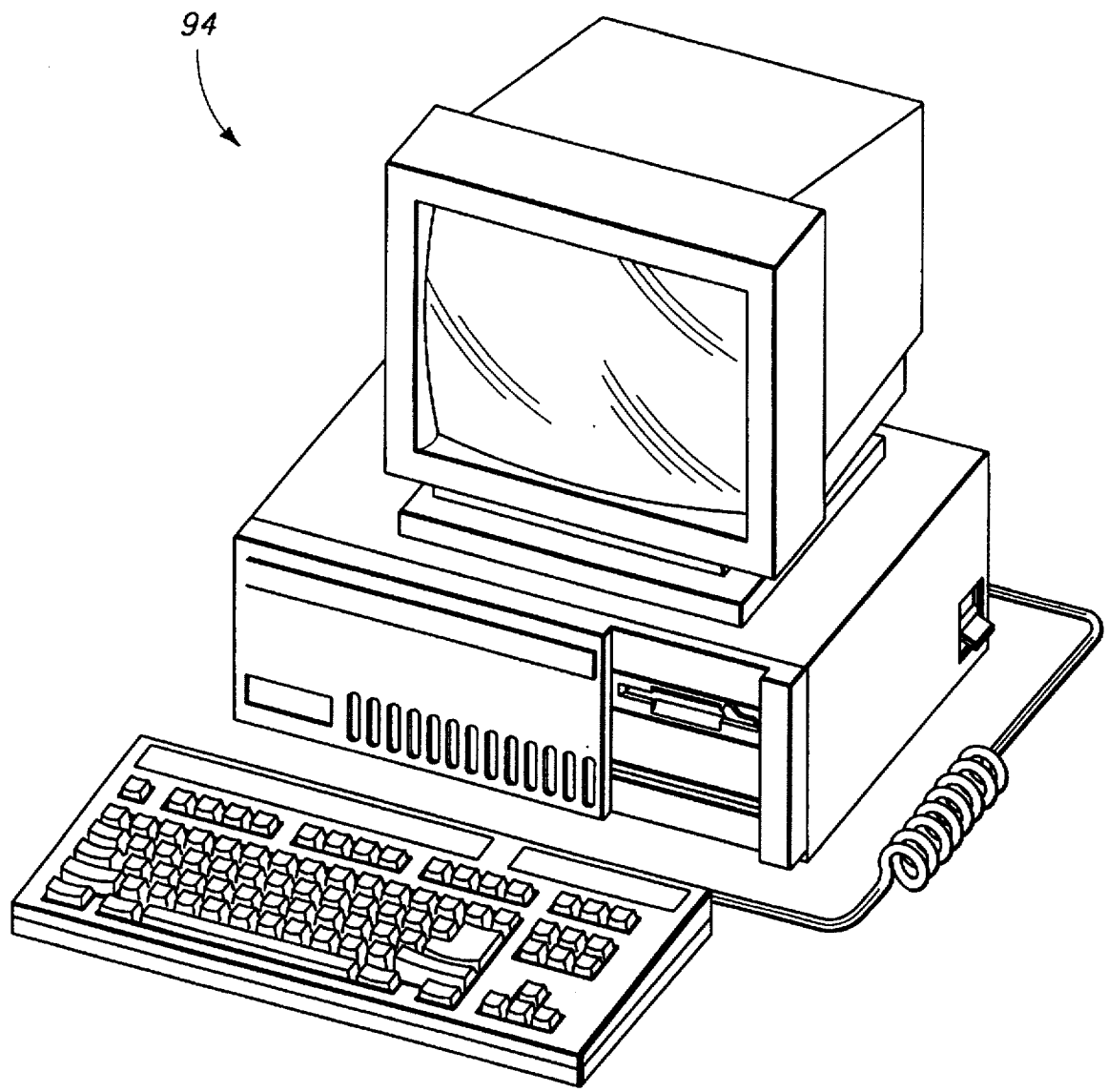
FIG. 6 is a perspective view of a computer embodying the invention.
Figure 7:
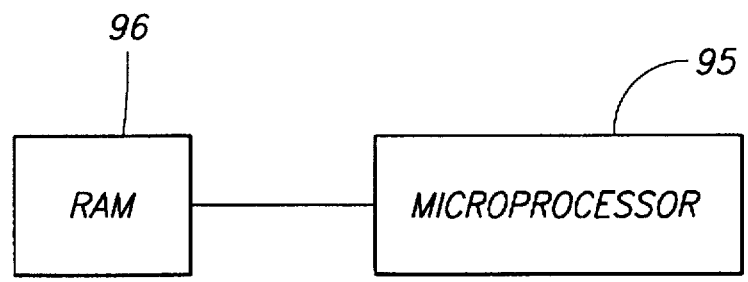
FIG. 7 is a block diagram showing components included in the computer of FIG. 6
Figure 8:
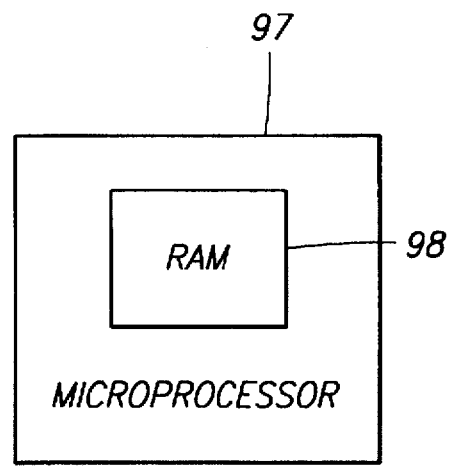
FIG. 8 is a block diagram showing components included in the computer of FIG. 6.

FIG. 6 shows a computer 94 embodying the invention. The computer 94 may be a personal computer, e.g., an IBM PC or AT, or having an Intel (TM) 286, 386, 486, Pentium, or higher processor or clone thereof. The computer 94 may also be a mini-computer, a micro-computer, a super computer, a UNIX machine, etc. The computer 94 includes (FIG. 7), among other things, a microprocessor 95 in communication with random access memory 96. The random access memory 96 is made up of a plurality of static random access memory cells 100, 200, 300, 400, 500, 600, 700, or 800 described below, or a combination thereof. Alternatively, the computer 94 includes a microprocessor 97 (FIG. 8) which itself has on-chip random access memory 98. The random access memory 98 is made up of a plurality of static random access memory cells 100, 200, 300, 400, 500, 600, 700, or 800 described below, or a combination thereof For example, the microprocessor 97 may include an on-chip cache including random access memory 98.

Figure 9:
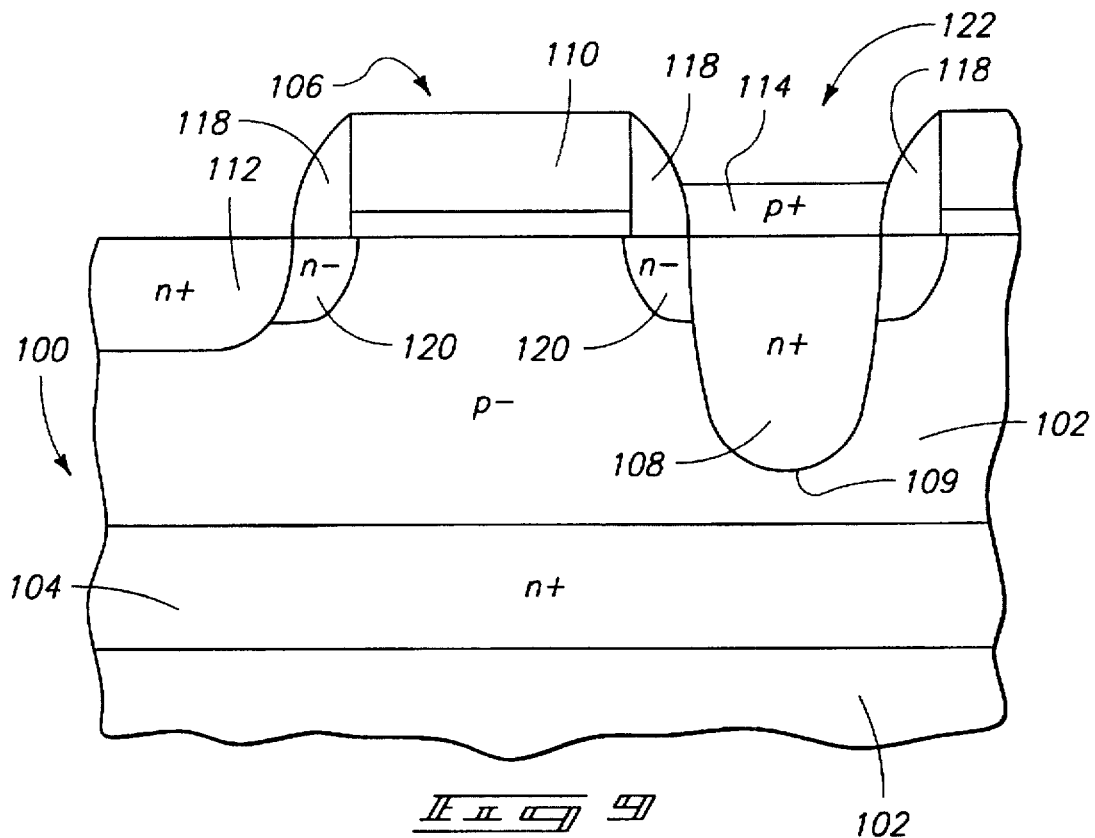
FIG. 9 is a diagrammatic sectional view of a wafer fragment comprising a static memory cell embodying the invention.

FIG. 9 shows a static random access memory cell 100 according to one embodiment of the invention. The memory cell 100 includes a bulk semiconductor silicon substrate 102. The substrate 102 is a p or p− substrate having an average p-type dopant concentration of between $1 \times 10^{15}$ ions/cm$^3$ and $1 \times 10^{18}$ ions/cm$^3$. In the most preferred embodiment, the substrate 102 has an average p-type dopant concentration of between $1 \times 10^{16}$ ions/cm$^3$ and $1 \times 10^{17}$ ions/cm$^3$.

The memory cell 100 further includes a buried n+ layer 104 in the substrate 102. The n-type layer 104 has an average n-type dopant concentration between $1 \times 10^{19}$ ions/cm$^3$ and $5 \times 10^{21}$ ions/cm$^3$. In the most preferred embodiment, the layer 104 has an average n-type dopant concentration between $1 \times 10^{20}$ ions/cm$^3$ and $5 \times 10^{20}$ ions/cm$^3$. In one embodiment, the buried n-type layer 104 is formed by a dose of $4 \times 10^{15}$ ions/cm$^2$ of arsenic at approximately 500 KeV.

The memory cell 100 further includes an n-channel transistor 106 formed over the buried n-type layer 104. The n-channel transistor 106 has an n+ memory node 108, a gate 110, and an n+ digit line node 112. In one illustrated embodiment, the memory node 108 is defined by the source of the transistor 106, and the digit line node 112 is formed by the drain of the transistor 106. In an alternative embodiment, the memory node 108 is defined by the drain of the transistor 106, and the digit line node 112 is formed by the source of the transistor 106.

The memory node 108 has an average n-type dopant concentration of between $1 \times 10^{19}$ ions/cm$^3$ and $5 \times 10^2$ ions/cm$^3$. In the most preferred embodiment, the memory node 108 has an average n-type dopant concentration between $5 \times 10^{19}$ and $1 \times 10^{20}$ ions/cm$^3$. The memory node 108 extends deeper into the substrate than the digit line node 112 so as to be an acceptable close distance from the buried n-type layer 104 More particularly, the source includes a lowest-most portion 109 which is <0.4 micron above the buried n-type layer In the most preferred embodiment, the lowest-most portion 109 of the source is <0.1 micron above the buried n-type layer. In one embodiment, the source is formed by implanting $1 \times 10^{15}$ ions/cm$^2$ arsenic at approximately 45 KeV, and subsequently implanting $1 \times 10^5$ ions/cm$^2$ phosphorus at approximately 200 KeV.

The digit line node 112 has an average n-type dopant concentration of between $1 \times 10^{19}$ ions/cm$^3$ and $5 \times 10^{21}$ ions/cm$^3$. In the most preferred embodiment, the digit line node 112 has an average n-type dopant concentration between $5 \times 10^{19}$ and $1 \times 10^{20}$ ions/cm$^3$. In one embodiment, the drain is formed by implanting $1 \times 10^{15}$ ions/cm$^2$ arsenic at 45 KeV.

The memory cell 100 further includes a p+ region 114 in junction relation with the memory node 108 and defining a tunnel diode between the region 114 and the memory node 108. The region 114 comprises p-type material having an average p-type dopant concentration between $1 \times 10^{19}$ ions/cm$^3$ and $5 \times 10^{21}$ ions/cm$^3$. In the embodiment shown in FIG. 9, the p-type region comprises epitaxial silicon grown over the source and is accordingly above the substrate 102.

The memory cell 100 further includes spacers 118, and LDD implants 120.

Figure 10:
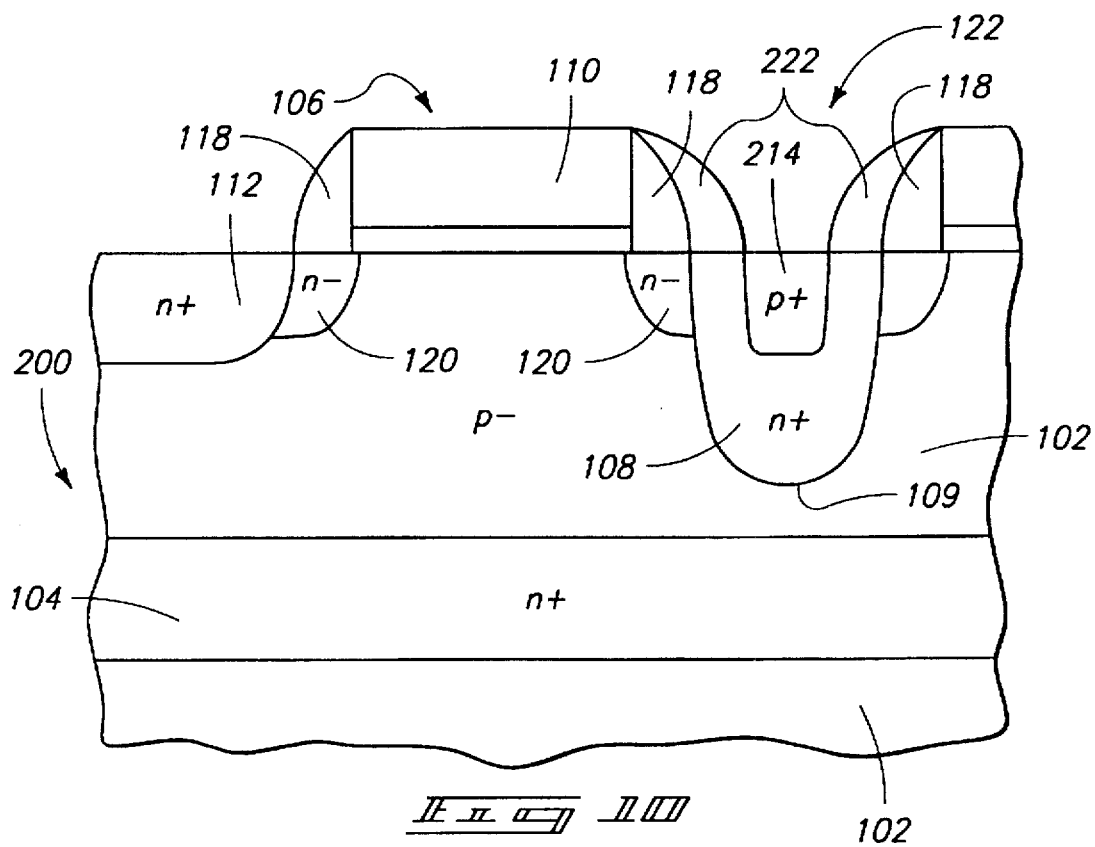
FIG. 10 is a diagrammatic sectional view of a wafer fragment comprising an alternative static memory cell embodying the invention.

FIG. 10 shows a static random access memory cell 200 which includes features similar to those of the memory cell 100 shown in FIG. 9, like reference numerals indicating like components, except that p-type region 214 comprises an implant in the source. The memory cell 200 includes a bulk semiconductor silicon substrate 102, and a buried n-type layer 104. The memory cell 200 further includes an n-channel transistor 106 formed over the buried n-type layer 104. The n-channel transistor 106 of memory cell 200 has a memory node 108, a gate 110, and a digit line node 112. The memory cell 200 further includes spacers 118. Region 214 within memory node 108 can be created by using additional spacers 222. The spacers 222 provide a mask to the p-type implant, thus concentrating the region 214 centrally relative to the lateral confines of the n-type memory node 108.

In operation, the p-type region 114 or 214 is held at a first voltage, while the n-type layer 104 is held at a second voltage, lower than the first voltage. The substrate 102 is held at some intermediate voltage to provide a slight forward bias (e.g., less than 0.2 Volt) between the n-type layer 104 and the substrate 102. The distance between the memory node 108 and the n-type layer 104 will determine the required voltage for the substrate 102. In one embodiment, the p-type region 114 is held at between 0.75 Volt and 1.5 Volts, the n-type layer 104 is held at a voltage lower than that of the p-type region 114 or 214, and the substrate is held at 0.2 Volts above the voltage of the n-type layer 104 for a distance of less than 0.4 micron between the memory node 108 and the n-type layer 104. In the most preferred embodiment, the p-type region 114 or 214 is held at 1 Volt, the n-type layer 104 is held at 0 Volts, and the substrate is held at 0.2 Volts for a distance of less than 0.4 micron between the memory node 108 and the n-type layer 104. The tunnel diode (formed by the p-type region 114 or 214 and the memory node 108) in combination with the buried n-type layer 104 work together to maintain a stable potential condition in the memory node 108. If voltage in the memory node 108 falls below this stable value, the tunnel diode effect will bring the voltage back up. If the voltage rises above this stable value, the npn transistor formed by the memory node 108, the substrate 102, and the buried layer 104 will work to bring it back down.

Figure 11:
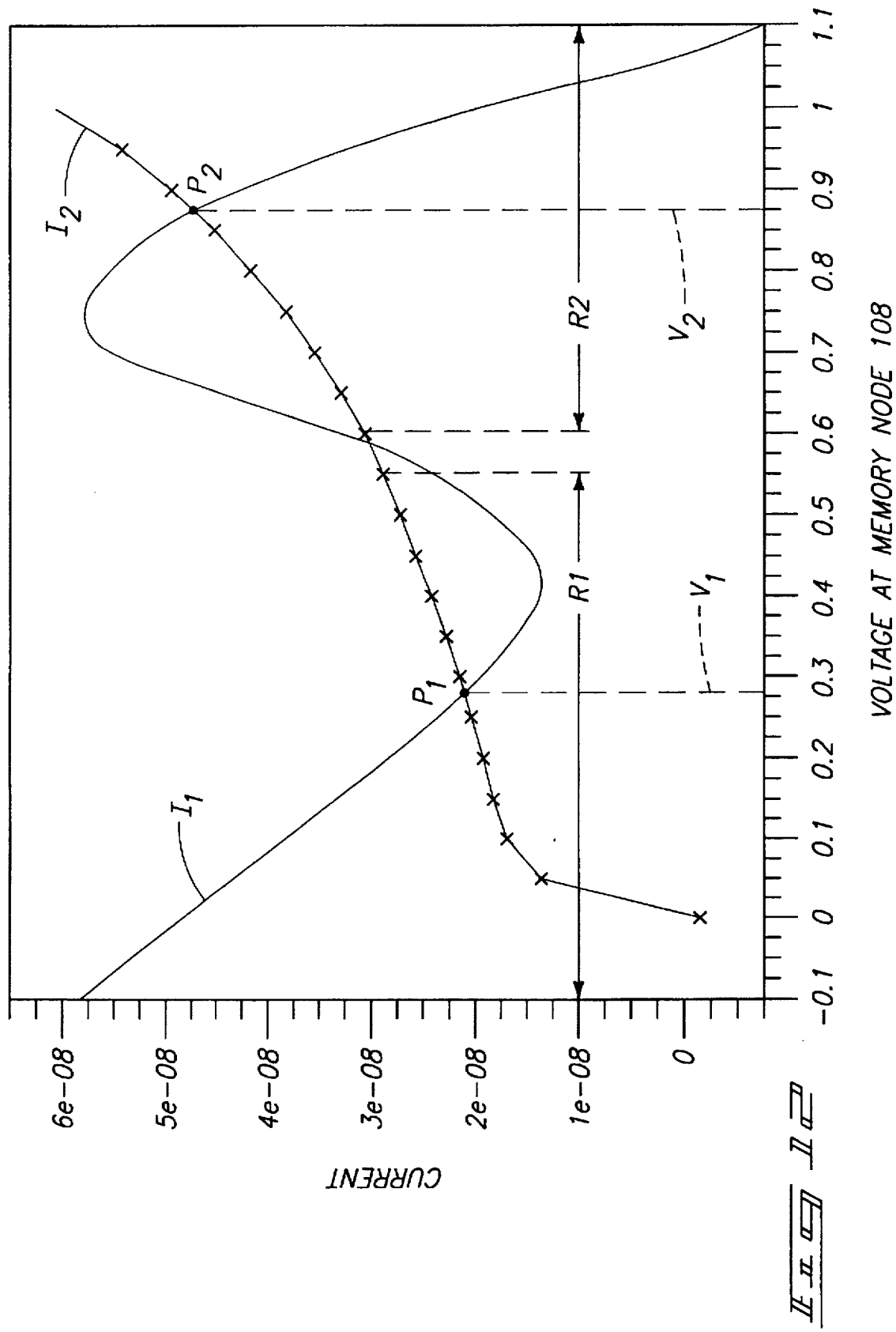
FIG. 11 is a circuit schematic of the static memory cell of FIG. 9.

FIG. 11 is a circuit schematic of the memory cell 100, and shows the digit line node 112, the gate 110, the tunnel diode 122, the memory node 108, the substrate 102, and the buried n-type layer 104. A parasitic npn transistor 116 is formed by the buried n-type layer 104, the substrate 102, and the memory node 108. The buried n-type layer 104 acts as an emitter of a parasitic npn transistor 116. The p-type substrate 102 acts as the base of the parasitic npn transistor 116, and the memory node 108 acts as the collector of the parasitic npn transistor 116. The npn transistor 116 is lightly biased into the active region so that it can serve as a current sink for the memory node 108. The amount of forward bias will be determined by the voltage at the substrate 102.

FIG. 12 is a plot of current vs. voltage for the SRAM 100 shown in FIG. 9. The initially descending curve $I_1$ illustrates current flowing from the p-type region 114 or 214 to the memory node 108. The other curve $I_2$ illustrates current flowing from the memory node 108 through the substrate 102 to the n-type layer 104.

In accordance with the invention the illustrated two stable states $P_1$ and $P_2$ are provided. With a constant voltage applied to the p-type region 114 or 214, and a differential between substrate 102 and n-type layer 104, any voltage on storage node 108 falling within the $R_1$ range will stabilize at point $P_1$ where $I_1=I_2$. Any deviation from $P_1$ within the $R_1$ range will cause non-zero current ($I_1-I_2$) to flow into ($I_1>I_2$) or out of ($I_1<I_2$) the node 108. Therefore, the voltage on node 108 will increase or decrease to $V_1$ and stabilize at point $P_1$. Likewise, any voltage within the $R_2$ region will stabilize at point $P_2$ due to the equalization of current $I_2$ and $I_2$. Note that there is another state which is an extraneous stable state or a metastable state where the $I_1$ and $I_2$ curves cross. However, any deviation from this undesirable point will cause the currents to equalize at either the $P_1$ or $P_2$ voltage states.

Accordingly, in operation, with zero Volts for the memory node 108, $I_1$ will equal $I_2$ with the source voltage stabilizing at the indicated state $P_1$. Consider the situation where a high voltage of, for example, one Volt is desired to be written and maintained in the memory node 108. Accordingly, a voltage slightly higher than one Volt is provided to the illustrated digit line node 112. The gate 110 is activated to cause one Volt to be provided in the illustrated memory node 108. The gate would subsequently be turned off. The result would be an $I_2$ which falls to the right of the illustrated stable $P_2$ point. The voltage would drop to the point where $I_1$ equals $I_2$ at the stable $P_2$ point, with voltage being maintained at the illustrated value on the x axis. Accordingly, the voltage would be maintained at this point and there would be no requirement for any refresh in contradistinction to a conventional DRAM cell in which there is constant leakage from the diffusion region to the substrate and through the capacitor.

Figure 13:
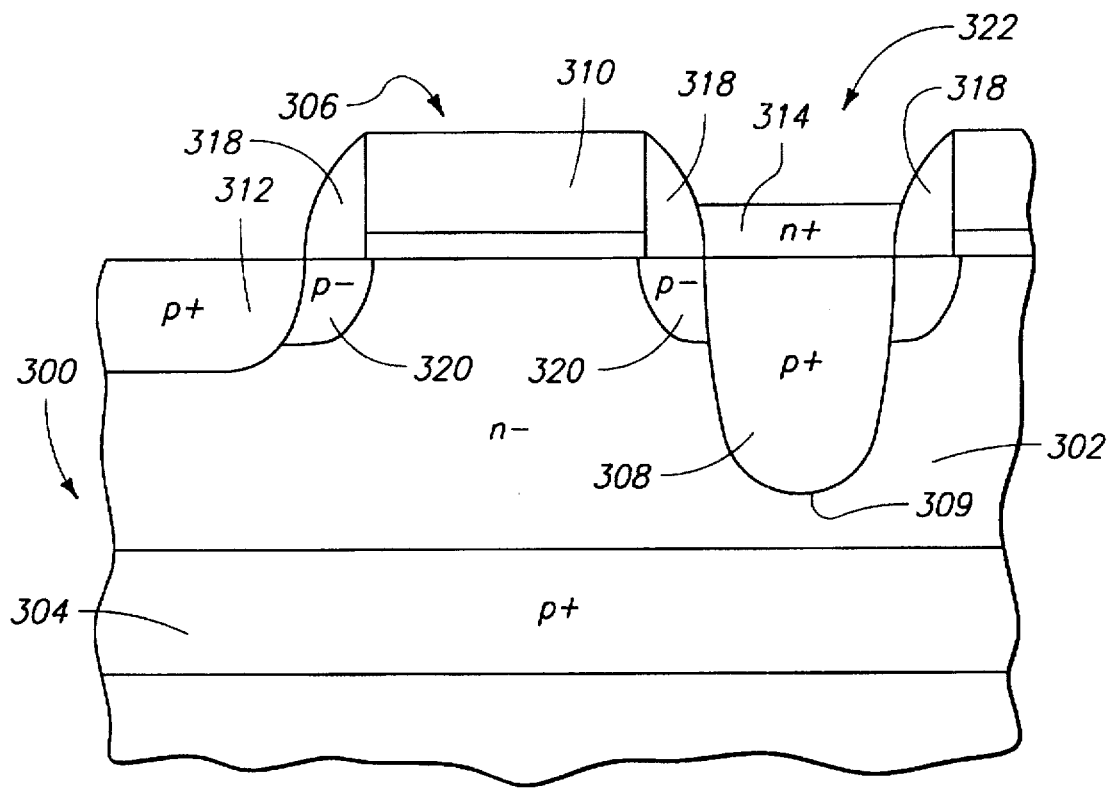
FIG. 13 is a diagrammatic sectional view of a wafer fragment comprising another alternative static memory cell embodying the invention.
Figure 14:
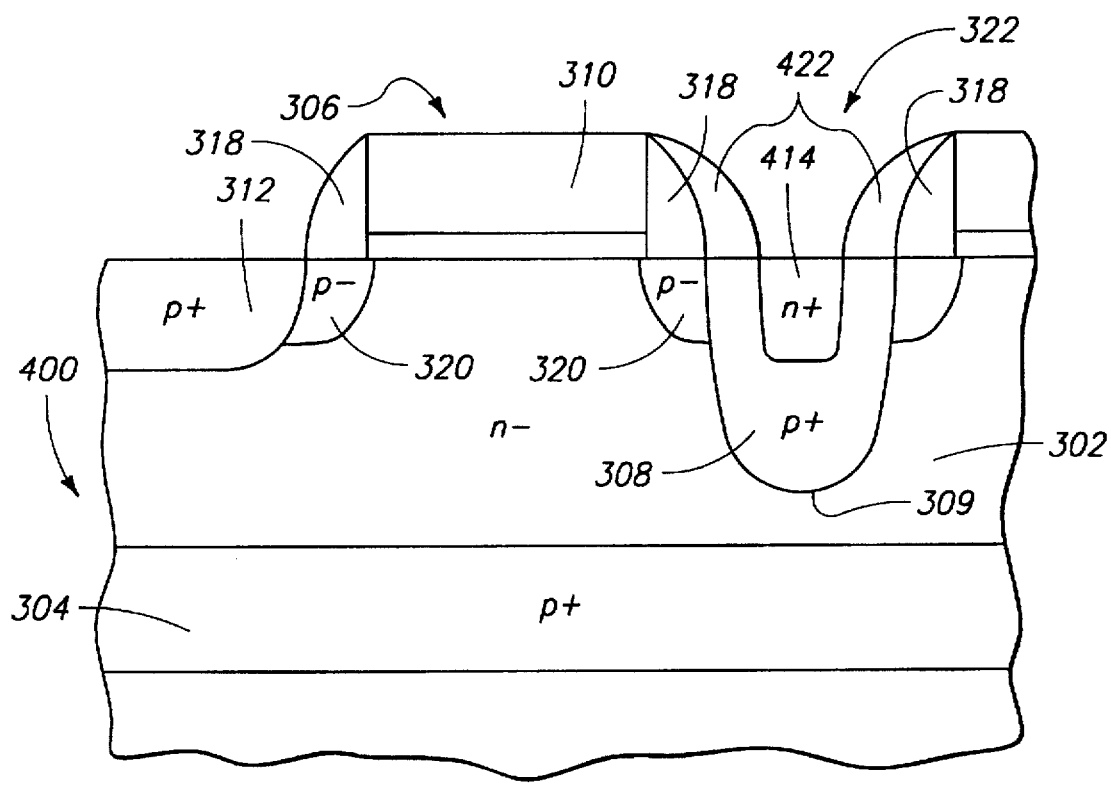
FIG. 14 is a diagrammatic sectional view of a wafer fragment comprising another alternative static memory cell embodying the invention.
Figure 11B:
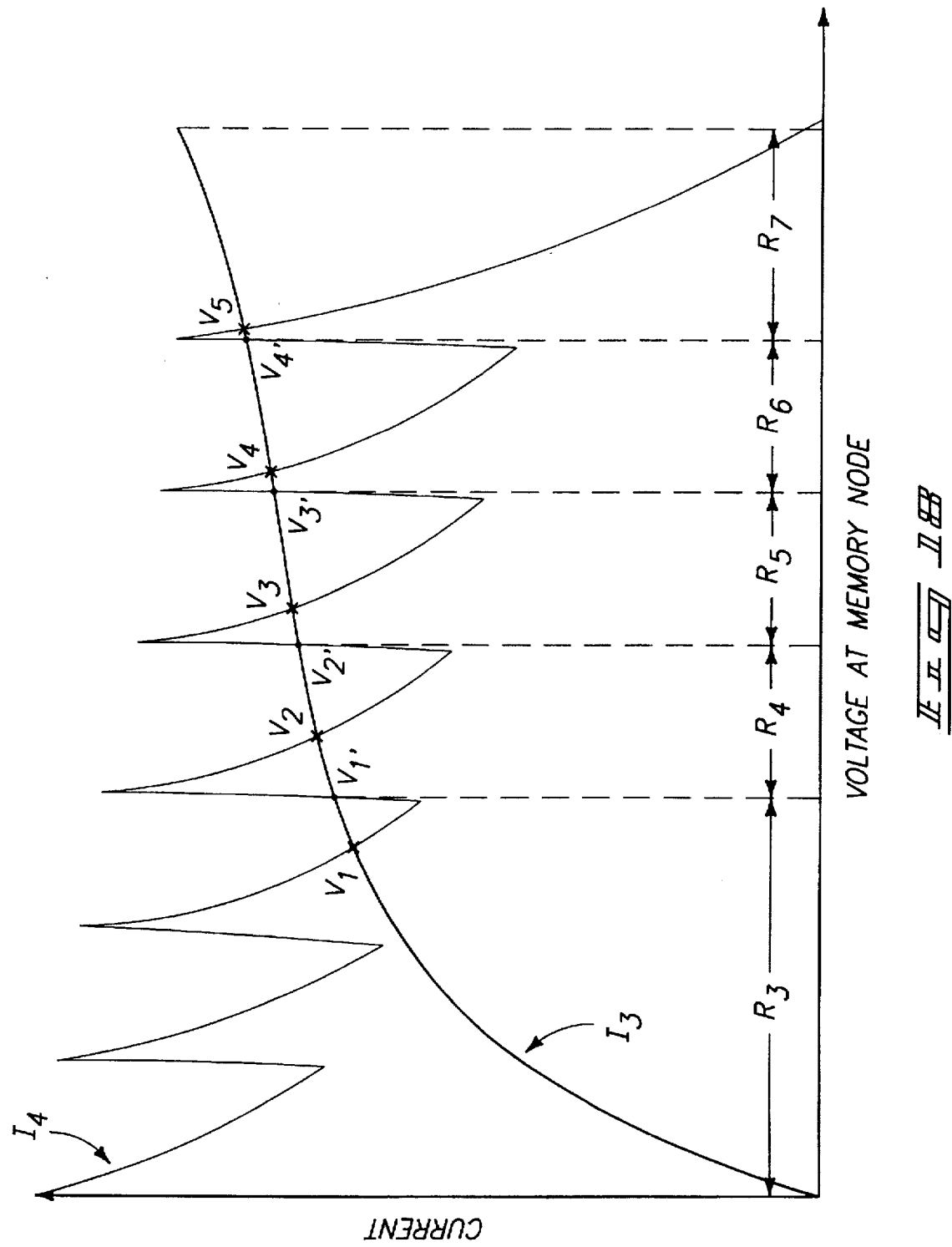

FIGS. 13 and 14 show alternative embodiments, complementary to the embodiments shown in FIGS. 9 and 10, with p-type material substituted for n-type material, n-type material substituted for p-type material, and with negative voltages applied instead of the various positive voltages. Operation is similar to the embodiments shown in FIG. 9 and 10. The embodiments shown in FIGS. 13 and 14 are manufactured using semiconductor processing steps that are substantially identical to the steps employed for manufacturing the embodiments of FIGS. 9 and 10, respectively, except with n-type material substituted for p-type material, and with p-type material substituted for n-type material.

More particularly, FIG. 13 shows a memory cell 300 including a substrate 302, and a p-channel transistor 306 formed over a buried p-type layer 304. The p-channel transistor 306 has a memory node 308, a gate 310, and a p+ digit line node 312. In one embodiment, the memory node 308 is defined by the source of the transistor 306, and the digit line node 312 is defined by the drain of the transistor. In an alternative embodiment, the memory node 308 is defined by the drain of the transistor 306, and the digit line node 312 is defined by the source of the transistor.

The memory node 308 has an average p-type dopant concentration of between $1\times10^{19}$ ions/cm$^3$ and $5\times10^{21}$ ions/cm$^3$. In the most preferred embodiment, the memory node 308 has an average p-type dopant concentration between $5\times10^{19}$ and $1\times10^{20}$ ions/cm$^3$. The memory node 308 extends deeper into the substrate than the digit line node 312 so as to be an acceptable close distance from the buried p-type layer 304. More particularly, the memory node includes a lowestmost portion 309 which is <0.4 micron above the buried p-type layer. In the most preferred embodiment, the lowestmost portion 309 of the memory node is <0.1 micron above the buried p-type layer 304.

The digit line node 312 has an average p-type dopant concentration of at between $1\times10^{19}$ ions/cm$^3$ and $5\times10^{21}$ ions/cm$^3$. In the most preferred embodiment, the digit line node 312 has an average p-type dopant concentration between $5\times10^{19}$ and $1\times10^{20}$ ions/cm$^3$.

The memory cell 300 further includes an n-type region 314 in junction relation with the memory node 308 and defining a tunnel diode between the n-type region 314 and the memory node 308. The n-type region in junction with the source comprises n-type material having an average n-type dopant concentration of at least $1\times10^{19}$.

The memory cell 300 further includes spacers 318, and LDD implants 320.

FIG. 14 shows a static random access memory cell 400 which includes features similar to those of the memory cell 300 shown in FIG. 13, like reference numerals indicating like components, except that n-type region 414 comprises an implant in the source. The memory cell 400 includes a bulk semiconductor silicon substrate 302, and a buried p-type layer 304. The memory cell 400 further includes an p-channel transistor 306 formed over the buried p-type layer 304. The p-channel transistor 306 of memory cell 400 has a memory node 308, a gate 310, and a digit line node 312. The memory cell 400 further includes spacers 318. Region 414 within memory node 308 can be created by using additional spacers 422. The spacers 422 provide a mask to the n-type implant, thus concentrating the region 414 centrally relative to the lateral confines of the memory node 308.

In operation, the n-type region 314 or 414 is held at a first voltage, while the p-type layer 304 is held at a second voltage, higher or less negative than the first voltage. The substrate 302 is held at some intermediate voltage. The distance between the memory node 308 and the p-type layer 304 will determine the required voltage for the substrate 302. In one embodiment, the n-type region 314 or 414 is held at between −0.75 Volt and −1.5 Volts, the p-type layer 304 is held at a voltage higher than that of the n-type region 314 or 414, and the substrate is held at 0.2 Volts below the voltage of the p-type layer 304 for a distance of less than 0.4 micron between the memory node 308 and the p-type layer 304. In the most preferred embodiment, the n-type region 314 or 414 is held at −1 Volt, the p-type layer 304 is held at 0 Volts, and the substrate is held at −0.2 Volts for a distance of less than 0.4 micron between the source 308 and the p-type layer 304.

FIG. 15 shows a static random access memory cell 500 which has multiple logic levels. The memory cell 500 includes a bulk semiconductor silicon substrate 502. The substrate 502 is a p or p- substrate. In one embodiment, the substrate has an average p-type dopant concentration of between $1\times10^{15}$ ions/cm$^3$ and $1\times10^{18}$ $^{ions/cm3}$. In a more preferred embodiment, the substrate 502 has an average p-type dopant concentration of between $1\times10^{16}$ ions/cm$^3$ and $1\times10^{17}$ ions/cm$^3$.

The memory cell 500 further includes a buried n+ layer 504 in the substrate 502. In one embodiment, the n-type layer 504 has an average n-type dopant concentration between $1\times10^{19}$ $^{ions/cm3}$ and $5\times10^{21}$ ions/cm$^3$. In a more preferred embodiment, the layer 504 has an average n-type dopant concentration between $1\times10^{20}$ ions/cm$^3$ and $5\times10^{20}$ ions/cm$^3$. In one embodiment, the buried n-type layer 504 is formed by a dose of $4\times10^{15}$ ions/cm$^2$ of arsenic at approximately 500 KeV.

The memory cell 500 further includes an n-channel transistor 506 formed over the buried n-type layer 504. The n-channel transistor 506 has an n+ memory node 508, a gate 510, and an n+ digit line node 512. In one illustrated embodiment, the memory node 508 is defined by the source of the transistor 506, and the digit line node 512 is formed by the drain of the transistor 506. In an alternative embodiment, the memory node 508 is defined by the drain of the transistor 506, and the digit line node 512 is formed by the source of the transistor 506.

In one embodiment, the memory node 508 has an average n-type dopant concentration of between $1\times10^{19}$ ions/cm$^3$ and $5\times10^{21}$ ions/cm$^3$. In a more preferred embodiment, the memory node 508 has an average n-type dopant concentration between $5\times10^{19}$ and $1\times10^{20}$ ions/cm$^3$. The memory node 508 extends deeper into the substrate than the digit line node 512 so as to be an acceptable close distance from the buried n-type layer 504. More particularly, in the illustrated embodiment, the memory node 508 includes a lowestmost portion 509 which is ≦0.4 micron above the buried n-type layer. In a more preferred embodiment, the lowestmost portion 509 of the memory node 508 is ≦0.1 micron above the buried n-type layer. In one embodiment, the memory node 508 is formed by implanting $1\times10^{15}$ ions/cm$^2$ arsenic at approximately 45 KeV, and subsequently implanting $1\times10^{15}$ ions/cm$^2$ phosphorus at approximately 200 KeV.

In one embodiment, the digit line node 512 has an average n-type dopant concentration of between $1\times10^{19}$ $^{ions/cm3}$ and $5\times10^{21}$ ions/cm$^3$. In a more preferred embodiment, the digit line node 512 has an average n-type dopant concentration between $5\times10^{19}$ and $1\times10^{21}$ ions/cm$^3$. In one embodiment, the drain is formed by implanting $1\times10^{15}$ ions/cm$^2$ arsenic at 45 KeV.

The memory cell 500 further includes layers 524, 526, 528, and 530 formed proximate (e.g., adjacent or over) the memory node or source 508 to define, in combination with the source 508, a resonant tunnel diode 522. More particularly, the layers 524, 526, 528, and 530 are formed on the source 508. In the illustrated embodiment, the layers 524, 526, 528, and 530 comprise a layer 524 of insulative material in junction relation to the source, a layer 526 of conductive material on the layer 524, a layer 528 of insulative material on the layer 526 and a layer 530 of conductive material on the layer 528. More particularly, the insulative layers 524 and 528 are silicon oxide layers, and the conductive layers 526 and 530 are silicon layers. The layer 530 defines a terminal for the resonant tunnel diode 522. Although the embodiments shown in FIGS. 15, 16, 19, and 20 have single resonant tunnel diode stacks (RTD stack), in alternative embodiments, multiple RTD stacks can be employed.

In one embodiment, the layers 524, 526, 528, and 530 are deposited by methods known to those of ordinary skill in the art. For example, in one embodiment, at least some layers are formed by chemical vapor deposition (e.g., low pressure chemical vapor deposition). In one embodiment, one or both of the layers 526 and 530 are polysilicon layers formed by depositing polysilicon itself, or formed by thermal treatment of amorphous silicon.

In one embodiment, the layers 524, 526, and 528 are each ultra-thin layers formed using ultra-high vacuum techniques. In the illustrated embodiment, the layer 524 is a layer of SiO$_2$ (silicon dioxide) or SiC, the layer 526 is a layer of silicon, the layer 528 is another layer of SiO$_2$ or SiC, and the layer 530 is a contact layer. In one embodiment, the ultra-thin layers are each about 10–20 atoms thick, or about 5 billionths of a meter thick. Each insulative layer 524 and 528 is a "tunnel barrier." The conductive layer 526 is a "quantum well." As voltage increases, energy of electrons increases and the wavelength of the electrons shortens. Eventually, a whole number of electron wavelengths fits inside the silicon layer, and a resonance condition is created. Electrons that are able to tunnel through the first silicon dioxide layer reflect back and forth many times, and some are eventually able to tunnel through the second silicon dioxide layer. As voltage is further increased, there are no longer electrons with the correct wavelength to pass through, and another "off" condition is established. As voltage further increases, the resonance condition can change again to allow large numbers of electrons to pass.

The memory cell 500 further includes spacers 518, and LDD implants 520.

FIG. 16 shows a static random access memory cell 600 which includes features similar to those of the memory cell 500 shown in FIG. 15, like reference numerals indicating like components, except that some or all of the regions defining, with the source, the resonant tunneling diode comprise an implant in the source. The memory cell 600 includes a bulk semiconductor silicon substrate 502, and a buried n-type layer 504. The memory cell 600 further includes an n-channel transistor 506 formed over the buried n-type layer 504. The n-channel transistor 506 of memory cell 600 has a memory node 608, a gate 610, and a digit line node 512. The memory cell 600 further includes spacers 518.

The memory cell 600 includes layers 624, 626, 628, and 630 formed proximate (e.g., over or adjacent) the memory node or source 508 to define, in combination with the source 608, a resonant tunnel diode 622. In the illustrated embodiment, the layers 624, 626, 628, and 630 comprise a layer 624 of insulative material in junction relation to the source, a layer 626 of conductive material on the layer 624, a layer 628 of insulative on the layer 626, and a layer 630 of conductive material on the layer 628. More particularly, the insulative layers 624 and 628 are silicon oxide layers, and the conductive layers 626 and 630 are silicon layers The layer 630 defines a terminal for resonant tunnel diode 522.

In one embodiment, the layers 624, 626, 628, and 630 are deposited by methods known to those of ordinary skill in the art. For example, in one embodiment, at least some layers are formed by chemical vapor deposition (e.g., low pressure chemical vapor deposition). In one embodiment, one or both of the layers 626 and 630 are polysilicon layers formed by depositing polysilicon itself, or formed by thermal treatment of amorphous silicon.

In one embodiment, the layers 624, 626, and 628 are each ultra-thin layers formed using ultra-high vacuum techniques. In the illustrated embodiment, the layer 624 is a layer of $SiO_2$ (silicon dioxide) or SiC, the layer 626 is a layer of silicon, the layer 628 is another layer of $SiO_2$ or SiC, and the layer 630 is a contact layer. In one embodiment, the ultra-thin layers are each about 10–20 atoms thick, or about 5 billionths of a meter thick. Each insulative layer 624 and 628 is a "tunnel barrier." The conductive layer 626 is a "quantum well."

In operation, the terminal 530 or 630 is held at a first voltage, while the n-type layer 504 is held at a second voltage, lower than the first voltage. The substrate 502 is held at some intermediate voltage to provide a slight forward bias (e.g., less than 0.2 Volt) between the n-type layer 504 and the substrate 502. The distance between the memory node 508 and the n-type layer 504 will determine the required voltage for the substrate 502. In one embodiment, the terminal 530 or 630 is held at between 0.75 Volt and 1.5 Volts, the n-type layer 504 is held at a voltage lower than that of the terminal 530 or 630, and the substrate is held at 0.2 Volts above the voltage of the n-type layer 504 for a distance of less than 0.4 micron between the memory node 508 and the n-type layer 504. In a more preferred embodiment, the terminal 530 or 630 is held at 1 Volt, the n-type layer 504 is held at 0 Volts, and the substrate is held at 0.2 Volts for a distance of less than 0.4 micron between the memory node 508 and the n-type layer 504. The tunnel diode (formed by the regions 524, 526, 528, and 530; or 624, 626, 628, and 630 and the memory node 508) in combination with the buried n-type layer 504 work together to provide multiple stable logic levels.

When the access transistor is turned off by applying a gate voltage lower than the threshold voltage of the access transistor, the leakage current from the storage node 508 through the transistor is much smaller than leakage current through the other components of the memory cell 500 or 600. In FIG. 17, $I_1$ represents current flowing into the storage node 508, and $I_2$ represents current flowing out of the storage node through a parasitic bipolar transistor 516. When the current $I_1$ and the current $I_2$ equalize, the voltage on the storage node 508 stays substantially unchanged through time. This defines an equalization point. The equalization point is stable when voltage deviation from the equalization point causes a current imbalance (a nonzero net current flow into or out of the storage node) which tends to restore the voltage on the storage node back to the equalization point. On the other hand, if the resulting current imbalance further deviates the voltage away from the equitation point, the equalization point is meta-stable.

FIG. 17 is a circuit schematic of the memory cell 500, and shows the digit line node 512, the gate 510 the resonant tunnel diode 522, the memory node 508, the substrate 502, and the buried n-type layer 504. A parasitic npn transistor 516 is formed by the buried n-type layer 504, the substrate 502, and the memory node 508. The buried n-type layer 504 acts as an emitter of the parasitic npn transistor 516. The p-type substrate 502 acts as the base of the parasitic npn transistor 516, and the memory node 508 acts as the collector of the parasitic npn transistor 516. The npn transistor 516 is lightly biased into the active region so that it can serve as a current sink for the memory node 508. The amount of forward bias will be determined by the voltage at the substrate 502.

FIG. 18 is a plot of current vs. voltage for the SRAM 500 shown in FIG. 15. FIG. 18 qualitatively shows the relationship of current $I_1$ and $I_2$ versus the voltage at the storage node 508. There are several equalization points labeled as $V_1-V_5$ and $V'_1-V'_4$ due to the multiple peak-valley property of the current-voltage curve for the resonant tunnel diode 522.

$V_1$ through $V_5$ are stable equalization points, while $V'_1$ through $V'_4$ are meta-stable equalization points. For example, if the voltage at the storage node 508 is initially at the point $V_1$ and it is perturbed slightly so that if it becomes larger than $V_1$, $I_2$ subsequently becomes larger than $I_1$ (see FIG. 18). This results in a net current flowing out of the storage node 508. Subsequently, the voltage at the storage node becomes lower which tends to restore the storage node voltage back to $V_1$ point.

In contrast, if the voltage at the storage node 508 is perturbed higher than the point $V_1'$ then $I_1$ becomes larger than $I_2$ and the voltage at the storage node 508 becomes larger and larger Therefore, the point $V_1'$ is meta-stable.

Multiple logic levels are provided in the cell. Any of these multiple logic levels can be stored by writing the storage node into any of the different stable points such as $V_1$ through $V_5$. In order to make the voltage at the storage node 508 fall on to a certain stable point such as any of $V_1$ through $V_5$, the access device is turned on and a voltage is applied on the digit line so that the storage node voltage is forced into a desired range $R_3-R_7$ shown in FIG. 18. The storage node voltage relaxes and stabilizes to a point $V_1-V_5$ in the range after the access device is turned off. In order to read which level is stored in the memory cell, the access device is turned on, the voltage level at the storage node 508 is sensed through the digit line and the stored state is thereby determined.

Figure 19:
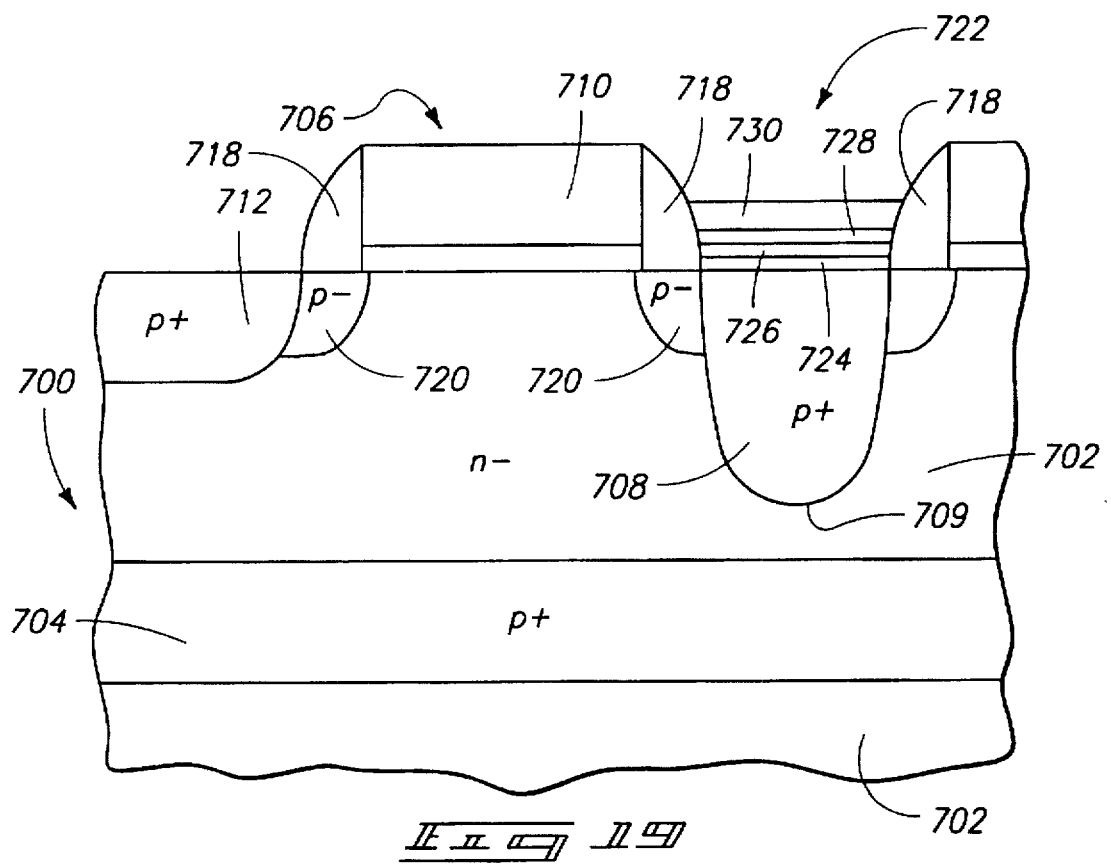
FIG. 19 is a diagrammatic sectional view of a wafer fragment comprising another alternative static memory cell embodying the invention and including a resonant tunnel diode.
Figure 20:
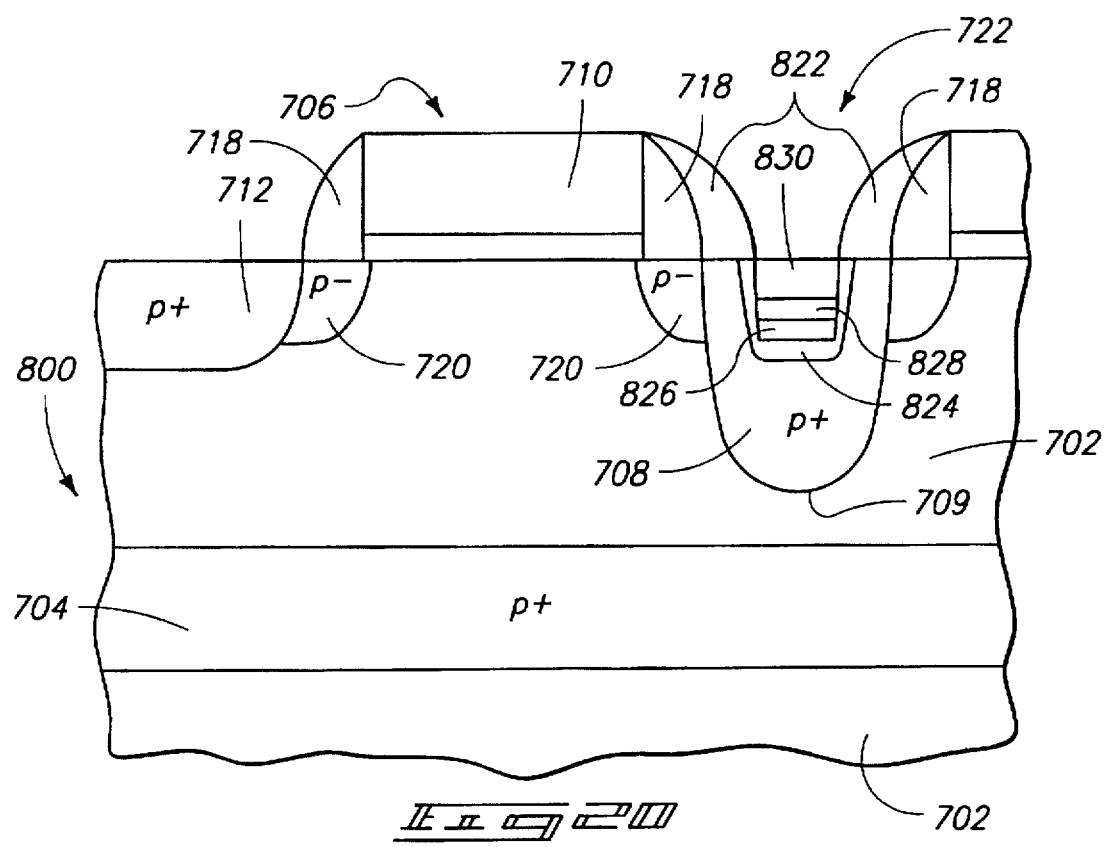
FIG. 20 is a diagrammatic sectional view of a wafer fragment comprising another alternative static memory cell embodying the invention and including a resonant tunnel diode.

FIGS. 19 and 20 show alternative embodiments, complementary to the embodiments shown in FIGS. 15 and 16, with p-type material substituted for n-type material, n-type material substituted for p-type material, and with negative voltages applied instead of the various positive voltages. Operation is similar to the embodiments shown in FIG. 15 and 16. The embodiments shown in FIGS. 19 and 20 are manufactured using semiconductor processing steps that are substantially identical to the steps employed for manufacturing the embodiments of FIGS. 15 and 16, respectively, except with n-type material substituted for p-type material, and with p-type material substituted for n-type material.

More particularly, FIG. 19 shows a memory cell 700 including a substrate 702, and a p-channel transistor 706 formed over a buried p-type layer 704. The p-channel transistor 706 has a memory node 708, a gate 710, and a p+ digit line node 712. In one embodiment, the memory node 708 is defined by the source of the transistor 706, and the digit line node 712 is defined by the drain of the transistor. In an alternative embodiment, the memory node 708 is defined by the drain of the transistor 706, and the digit line node 712 is defined by the source of the transistor.

The memory node 708 has an average p-type dopant concentration of between $1 \times 10^{19}$ ions/cm$^3$ and $5 \times 10^{21}$ ions/cm$^3$. In the most preferred embodiment, the memory node 708 has an average p-type dopant concentration between $5 \times 10^{19}$ and $1 \times 10^{20}$ ions/cm$^3$. The memory node 708 extends deeper into the substrate than the digit line node 712 so as to be an acceptable close distance from the buried p-type layer 704. More particularly, the memory node includes a lowestmost portion 709 which is $\leq 0.4$ micron above the buried p-type layer. In the most preferred embodiment, the lowestmost portion 709 of the memory node is $\leq 0.1$ micron above the buried p-type layer 704.

The digit line node 712 has an average p-type dopant concentration of at between $1 \times 10^{19}$ ions/cm$^3$ and $5 \times 10^{21}$ ions/cm$^3$. In the most preferred embodiment, the digit line node 712 has an average p-type dopant concentration between $5 \times 10^{19}$ and $1 \times 10^{20}$ ions/cm$^3$.

The memory cell 700 further includes layers 724, 726, 728, and 730 formed proximate (e.g., adjacent or over) the memory node or source 708 to define, in combination with the source 708, a resonant tunnel diode 722. More particularly, the layers 724, 726, 728, and 730 are formed on the source 708. In the illustrated embodiment, the layers 724, 726, 728, and 730 comprise a layer 724 of insulative material in junction relation to the source, a layer 726 of conductive material on the layer 724, a layer 728 of insulative on the layer 726, and a layer 730 of conductive material on the layer 728. More particularly, the insulative layers 724 and 728 are silicon oxide layers, and the conductive layers 726 and 730 are silicon layers. The layer 730 defines a terminal for resonant tunnel diode 722.

In one embodiment, the layers 724, 726, 728, and 730 are deposited by methods known to those of ordinary skill in the art. For example, in one embodiment, at least some layers are formed by chemical vapor deposition (e.g., low pressure chemical vapor deposition). In one embodiment, one or both of the layers 726 and 730 are polysilicon layers formed by depositing polysilicon itself, or formed by thermal treatment of amorphous silicon.

In one embodiment, the layers 724, 726, and 728 are each ultra-thin layers formed using ultra-high vacuum techniques. In the illustrated embodiment, the layer 724 is a layer of SiO$_2$ (silicon dioxide) or SiC, the layer 726 is a layer of silicon, the layer 728 is another layer of SiO$_2$ or SiC, and the layer 730 is a contact layer. In one embodiment, the ultra-thin layers are each about 10–20 atoms thick, or about 5 billionths of a meter thick. Each insulative layer 724 and 728 is a "tunnel barrier." The conductive layer 726 is a "quantum well."

The memory cell 700 further includes spacers 718, and LDD implants 720.

FIG. 20 shows a static random access memory cell 800 which includes features similar to those of the memory cell 700 shown in FIG. 19, like reference numerals indicating like components, except that one or more regions 824, 826, 828, and 830 comprise an implant in the source. The regions 824, 826, 828, and 830 define, in combination with the the source, a resonant tunnel diode 722. The memory cell 800 includes a bulk semiconductor silicon substrate 702, and a buried p-type layer 704. The memory cell 800 further includes an p-channel transistor 706 formed over the buried p-type layer 704. The p-channel transistor 706 of memory cell 800 has a memory node 708, a gate 710, and a digit line node 712. The memory cell 800 further includes spacers 718. In operation, the terminal 730 or 830 is held at a first voltage, while the p-type layer 704 is held at a second voltage, higher or less negative than the first voltage. The substrate 702 is held at some intermediate voltage. The distance between the memory node 708 and the p-type layer 704 will determine the required voltage for the substrate 702. In one embodiment, the terminal 730 or 830 is held at between $-0.75$ Volt and $-1.5$ Volts, the p-type layer 704 is held at a voltage higher than that of the terminal 730 or 830, and the substrate is held at 0.2 Volts below the voltage of the p-type layer 704 for a distance of less than 0.4 micron between the memory node 708 and the p-type layer 704. In a more preferred embodiment, the terminals 730 and 830 are held at $-1$ Volt, the p-type layer 704 is held at 0 Volts, and the substrate is held at $-0.2$ Volts for a distance of less than 0.4 micron between the source 708 and the p-type layer 704.

Thus, an SRAM has been disclosed which is more compact than current SRAMS, and which requires fewer MOSFETS. Further, an SRAM has been disclosed that has more than two logic states. By being able to store an increased number of logic states, bit-density can be increased. For example, in one embodiment, an SRAM has ten logic states for easy computation using a base 10 numbering system. Alternatively, logic can be employed to take advantage of other numbers of logic states employed, much like binary logic is presently employed to take advantage of devices having two logic states. The SRAM has the advantage of not requiring refresh, and further has the advantage of smaller size.

To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. The term "proximate" is defined to mean near, or adjacent, but not necessarily in contact.

In compliance with the statute, the invention has been described in language more or less specific as to structural and methodical features. It is to be understood, however, that the invention is not limited to the specific features shown and described since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A static memory cell comprising:
   a semiconductor substrate of a first conductivity type;
   a buried layer in the substrate, the buried layer having a second conductivity type opposite to the first conductivity type, and the buried layer having an average dopant concentration of at least $1 \times 10^{19}$ ions/cm$^3$;
   a transistor formed relative to the substrate over the buried layer, the transistor having a channel of the second conductivity type, and the transistor having a gate, a memory node having an average dopant concentration of at least $1 \times 10^{19}$ ions/cm$^3$, and a digit line node having an average dopant concentration of at least $1 \times 10^{19}$ ions/cm$^3$; and
   alternating layers of insulative and conductive material formed relative to the memory node to form, in combination with the memory node, a resonant tunnel diode.

2. A static memory cell in accordance with claim 1 wherein the first conductivity type is positive, and the second conductivity type is negative.

3. A static memory cell in accordance with claim 1 wherein the first conductivity type is negative and the second conductivity type is positive.

4. A static memory cell in accordance with claim 1 wherein the memory node includes a lowermost portion which is ≦0.1 micron above the buried layer.

5. A static memory cell in accordance with claim 1 wherein the memory node includes a lowermost portion which is ≦0.4 micron above the buried layer.

6. A static memory cell in accordance with claim 1 wherein the substrate comprises material having an average dopant concentration of at least $1\times10^{16}$ ions/cm$^3$.

7. A semiconductor processing method in accordance with claim 1 wherein the layers formed relative to the memory node comprise alternating layers of silicon and silicon oxide stacked on the source, including two layers of silicon and two layers of silicon oxide, one of the layers of silicon oxide being in junction relation to the memory node.

8. A static memory cell comprising:

a semiconductor substrate of a first conductivity type;

a buried layer in the substrate, the buried layer having a second conductivity type opposite to the first conductivity type;

a transistor formed relative to the substrate over the buried layer, the transistor having a source of the second conductivity type, a gate, and a drain of the second conductivity type, the source having a depth in the substrate greater than the depth of the drain; and alternating layers of insulative and conductive material formed relative to the source, including two conductive layers and two insulative layers, one of the insulative layers being in junction relation to the source.

9. A static memory cell in accordance with claim 8 wherein the first conductivity type is positive, and the second conductivity type is negative.

10. A static memory cell in accordance with claim 8 wherein the first conductivity type is negative, and the second conductivity type is positive.

11. A static memory cell in accordance with claim 8 wherein the source includes a lowermost portion which is ≦0.4 micron above the buried layer.

12. A static memory cell in accordance with claim 8 wherein the source includes a lowermost portion which is ≦0.1 micron above the buried layer.

13. A static memory cell in accordance with claim 8 wherein the substrate comprises material having an average dopant concentration of at least $1\times10^{16}$ ions/cm$^3$.

14. A static memory cell in accordance with claim 8 wherein the layers formed proximate the source comprise alternating layers of silicon and silicon oxide.

15. A static memory cell in accordance with claim 8 wherein the dose of n-type material for the source is greater than the dose of n-type material for the drain.

16. A static memory cell comprising:

a semiconductor substrate;

a transistor formed in the substrate, the transistor including a gate, a first n+ region having a depth in the substrate, and a second n+ region having a depth in the substrate greater than the depth of the first n+ region;

an n+ buried layer below the second n+ region; and alternating layers of insulative and conductive material formed relative to the second n+ region and defining, in combination with the second n+ region, a resonant tunnel diode.

17. A static memory cell in accordance with claim 16 wherein the layers formed proximate the source comprise alternating layers of silicon and silicon oxide on the source, including two layers of silicon and two layers of silicon oxide, one of the layers of silicon oxide being in junction relation to the source.

18. A static memory cell comprising:

a semiconductor substrate;

a transistor formed in the substrate, the transistor including a gate, a first p+ region having a depth in the substrate, and a second p+ region having a depth in the substrate greater than the depth of the first p+ region;

a p+ buried layer below the second p+ region; and alternating layers of insulative and conductive material formed relative to the second p+ region and forming, in combination with the second p+ region, a resonant tunnel diode.

19. A static memory cell in accordance with claim 18 wherein the layers formed proximate the second p+ region comprise alternating layers of silicon and silicon oxide on the p+ region, including two layers of silicon and two layers of silicon oxide, one of the layers of silicon oxide being in junction relation to the source.

20. A static memory cell comprising:

a p-type semiconductor substrate having an average p-type dopant concentration of at least $1\times10^{16}$ ions/cm$^3$ and being connected to a first voltage;

a buried n-type diffusion layer in the substrate, the n-type layer having an average n-type dopant concentration of at least $1\times10^{19}$ ions/cm$^3$ and being connected to a second voltage lower than the first voltage;

an n-channel transistor formed over the buried n-type layer the n-channel transistor having a source, a gate, and a drain, the source having an average n-type dopant concentration of at least $1\times10^{19}$ ions/cm$^3$ and the drain having an average n-type dopant concentration of at least $1\times10^{19}$ ions/cm$^3$; and alternating layers of insulative and conductive material formed proximate the source, including two conductive layers and two insulative layers, and defining, in combination with the source, a resonant tunnel diode, the layers including a lower insulative layer in junction relation to the source and an upper conductive layer defining a terminal for the resonant tunnel diode, the terminal for the resonant tunnel diode being connected to a third voltage higher than the first voltage.

21. A static memory cell in accordance with claim 20 wherein the source includes a lowermost portion which is ≦0.4 micron above the n-type diffusion layer.

22. A static memory cell in accordance with claim 20 wherein the source includes a lowermost portion which is ≦0.1 micron above the n-type diffusion layer.

23. A static memory cell in accordance with claim 20 wherein the first voltage is 1 Volt.

24. A static memory cell in accordance with claim 20 wherein the second voltage is 0 Volts.

25. A static memory cell comprising:

an n-type semiconductor substrate having an average n-type dopant concentration of at least $1\times10^6$ ions/cm$^3$ and being connected to a first voltage;

a buried p-type diffusion layer in the substrate, the p-type layer having an average p-type dopant concentration of at least $1\times10^{19}$ ions/cm$^3$ and being connected to a second voltage greater than the first voltage;

a p-channel transistor formed relative to the substrate over the buried p-type layer, the p-channel transistor having a source, a gate, and a drain, the source having an average p-type dopant concentration of at least $1 \times 10^{19}$ ions/cm$^3$ and the drain having an average p-type dopant concentration of at least $1 \times 10^9$ ions/cm$^3$; and alternating layers of insulative and conductive material formed relative to the source, including two conductive layers and two insulative layers, and forming, in combination with the source, a resonant tunnel diode, the layers including a lower insulative layer in junction relation to the source and an upper conductive layer forming a terminal for the resonant tunnel diode, the terminal for the resonant tunnel diode being connected to a third voltage lower than the first voltage.

26. A static memory cell in accordance with claim 25 wherein the source includes a lowermost portion which is $\leq 0.4$ micron above the p-type diffusion layer.

27. A static memory cell in accordance with claim 25 wherein the source includes a lowermost portion which is $\leq 0.1$ micron above the p-type diffusion layer.

28. A static memory cell in accordance with claim 25 wherein the first voltage is $-1$ Volt.

29. A static memory cell in accordance with claim 25 wherein the second voltage is 0 Volts.

30. A static memory cell comprising:

an n-channel MOSFET having a drain, gate, and source;

a npn transistor having a base, a collector, and an emitter; and alternating layers of conductive and insulative material defining, in combination with the source of the MOSFET, a resonant tunnel diode, the resonant tunnel diode having an anode connected to a first voltage and a cathode connected to the collector of the npn transistor.

31. A static memory cell in accordance with claim 30 wherein the emitter of the npn transistor comprises a buried n-type layer under the source of the MOSFET.

32. A static memory cell consisting essentially of:

an n-channel MOSFET having a gate, a drain, and a source;

a buried layer of n-type material under the source; and alternating layers of insulative and conductive material formed adjacent the source to define, with the source, a resonant tunnel diode.

33. A static memory cell consisting essentially of:

a MOSFET having a gate a drain, and a source;

a buried layer under the source; and a region in junction relation with the source and operating with the source as a resonant tunnel diode.

34. A static memory cell consisting essentially of:

a p-channel MOSFET having a gate, a drain, and a source;

a buried layer of p-type material under the source; and alternating layers of insulative and conductive material formed adjacent the source to define, with the source, a resonant tunnel diode.

* * * * *

UNITED STATES PATENT AND TRADEMARK OFFICE
CERTIFICATE OF CORRECTION

PATENT NO. : 5,757,051

DATED : May 26, 1998

INVENTOR(S) : Jeff Z. Wu et al.

It is certified that error appears in the above-identified patent and that said Letters Patent is hereby corrected as shown below:

Column 6, line 8, replace "$5x10^2$" with --$5x10^{21}$--.
Column 6, line 20, replace "$1x10^5$" with --$1x10^{15}$--.
Column 7, line 44, replace "$I_2$ and $I_2$" with --$I_1$ and $I_2$--.
Column 8, line 29, replace "<0.4" with --$\leq$ 0.4--.
Column 8, line 31, replace "<0.1" with --$\leq$ 0.1--.
Column 9, line 17, replace "$1x10^{18}$ $^{ions/cm3}$." with --$1x10^{18}$ ions/cm$^3$.--
Column 9, line 24, replace "$1x10^{19}$ $^{ions/cm3}$" with --$1x10^{19}$ ions/cm$^3$--.
Column 9, line 57, replace "$1x10^{19}$ $^{ions/cm3}$" with --$1x10^{19}$ ions/cm$^3$--.
Column 9, line 60, replace "$1x10^{21}$" with --$1x10^{20}$--.
Column 11, line 3, insert --.-- after "silicon layers".
Column 12, line 30, insert --.-- after "larger".
Column 13, line 23, replace "708," with --708.--.
Column 13, line 58, remove the second "the".
Column 15, line 5, replace "negatives" with --negative--.
Column 16, line 60, replace "$1x10^6$" with --$1x10^{16}$--.
Column 17, line 4, replace "$1x10^9$" with --$1x10^{19}$--.
Column 18, line 16, insert --,-- after "gate".

Signed and Sealed this

Eleventh Day of August 1998

*Attest:*

BRUCE LEHMAN

*Attesting Officer*     Commissioner of Patents and Trademarks